US010910060B1

(12) United States Patent
Wu et al.

(10) Patent No.: US 10,910,060 B1
(45) Date of Patent: Feb. 2, 2021

(54) SELECT LINE VOLTAGE WAVEFORM REAL-TIME MONITOR FOR NON-VOLATILE MEMORY

(71) Applicant: SanDisk Technologies LLC, Addison, TX (US)

(72) Inventors: Jianzhi Wu, Milpitas, CA (US); Xiang Yang, Santa Clara, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/568,986

(22) Filed: Sep. 12, 2019

(51) Int. Cl.
G11C 16/10 (2006.01)
G11C 16/04 (2006.01)
G11C 16/08 (2006.01)
G11C 16/26 (2006.01)
G11C 16/32 (2006.01)

(52) U.S. Cl.
CPC .......... G11C 16/10 (2013.01); G11C 16/0483 (2013.01); G11C 16/08 (2013.01); G11C 16/26 (2013.01); G11C 16/32 (2013.01)

(58) Field of Classification Search
CPC ......... G11C 16/10; G11C 16/08; G11C 16/26; G11C 16/0483; G11C 16/32
See application file for complete search history.

(56) References Cited

U.S. PATENT DOCUMENTS 8,514,630 B2 8/2013 Huynh et al.
8,670,285 B2 3/2014 Dong et al.
8,837,228 B2 * 9/2014 Nam ................. G11C 16/0483
365/185.29
9,443,597 B2 * 9/2016 Dutta ..................... G11C 16/14
9,490,021 B2 * 11/2016 Yang ...................... G11C 16/16
9,514,828 B2 * 12/2016 Shim ...................... G11C 16/24
9,697,901 B2 * 7/2017 Nam ....................... G11C 16/16
9,715,938 B2 7/2017 Yang et al.
9,947,395 B2 4/2018 Louie et al.

(Continued)

FOREIGN PATENT DOCUMENTS

WO WO2014/163995 A1 10/2014
WO WO2019/022811 A1 1/2019

OTHER PUBLICATIONS

International Search Report & the Written Opinion of the International Searching Authority dated Jul. 10, 2020, International Application No. PCT/US2020/025566.

*Primary Examiner* — Tri M Hoang
(74) *Attorney, Agent, or Firm* — Vierra Magen Marcus LLP

(57) ABSTRACT

An apparatus comprising strings of non-volatile memory cells is disclosed. Each string comprises non-volatile memory cells, an operative select gate, and a dummy select gate. The apparatus comprises a select line connected to the operative select gate of each string, and a dummy line connected to the dummy select gate of each string. The dummy line is an immediate neighbor to the select line. The apparatus comprises a control circuit configured to apply a voltage waveform to the select line while the dummy line is floating. The control circuit is configured to detect a floating voltage on the dummy line while applying the voltage waveform to the select line. The control circuit is configured to determine a condition of the voltage waveform at a target location on the select line based on the floating voltage on the dummy line.

20 Claims, 22 Drawing Sheets

(56) References Cited

U.S. PATENT DOCUMENTS

| | | |
|---|---|---|
| 10,090,056 B2 | 10/2018 | Hioka |
| 2009/0086547 A1 | 4/2009 | Tang |
| 2009/0129159 A1 | 5/2009 | Mokhlesi |
| 2011/0317493 A1 | 12/2011 | Chang et al. |
| 2014/0036598 A1* | 2/2014 | Yang .................. G11C 11/5635 365/185.22 |
| 2014/0247665 A1 | 9/2014 | Avila et al. |
| 2015/0003161 A1 | 1/2015 | Avila et al. |
| 2017/0140829 A1 | 5/2017 | Park et al. |
| 2019/0287618 A1* | 9/2019 | Kimura .................. G11C 16/16 |

\* cited by examiner

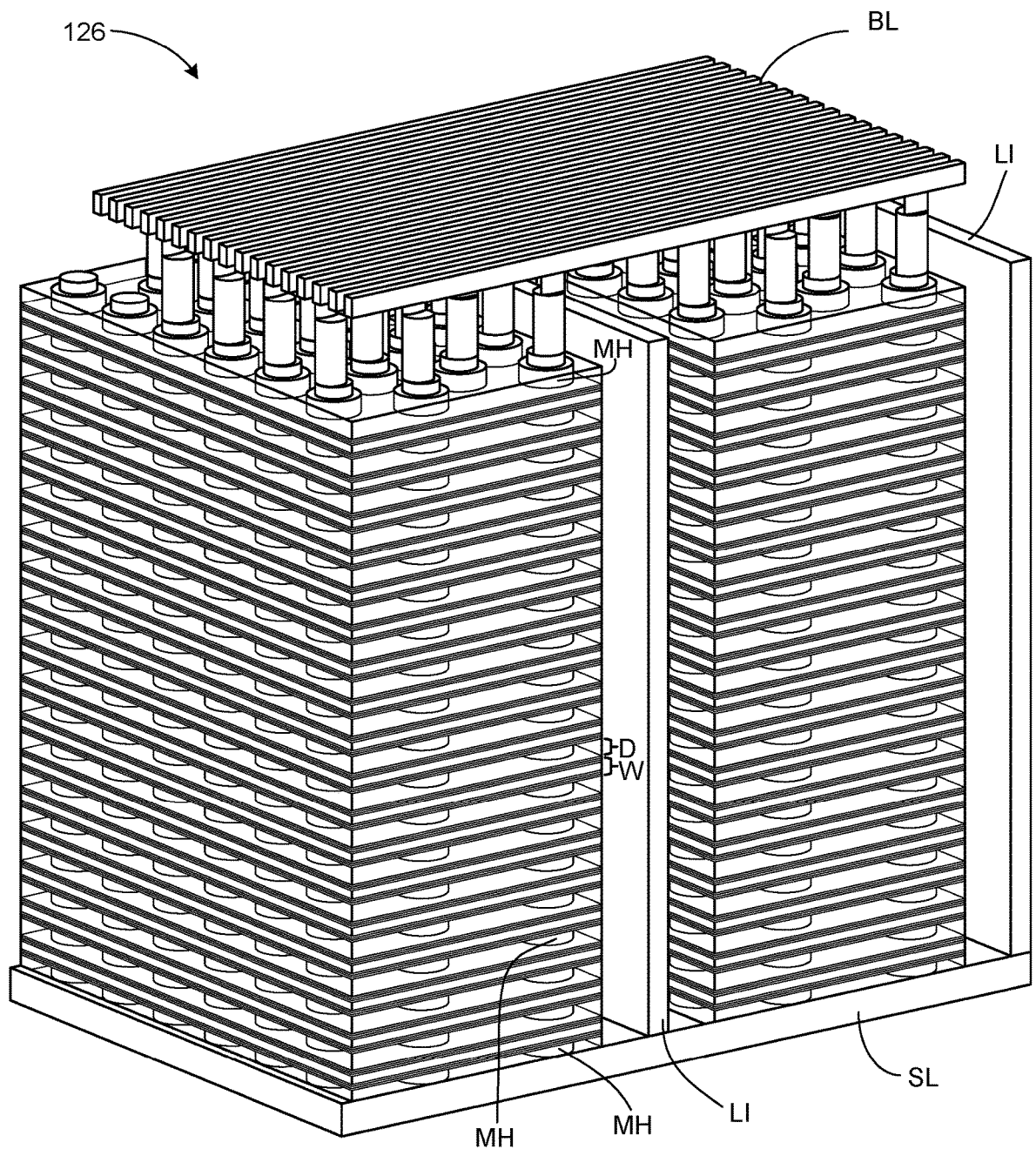

FIG. 4C
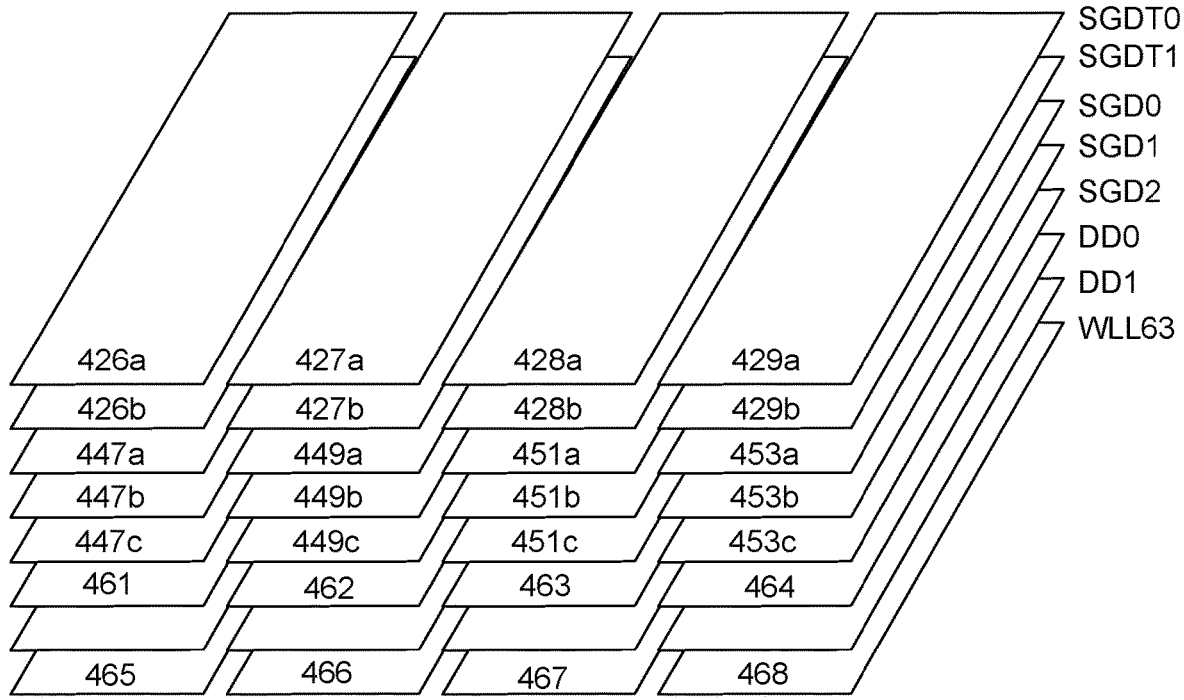
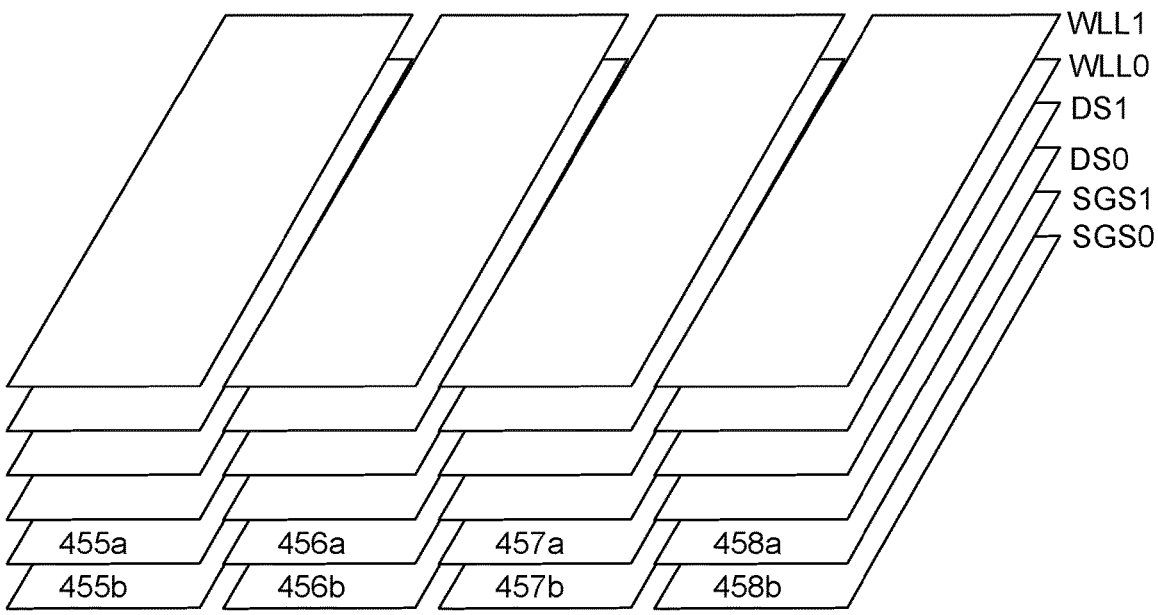

SELECT LINE VOLTAGE WAVEFORM REAL-TIME MONITOR FOR NON-VOLATILE MEMORY

BACKGROUND

The present technology relates to the operation of memory devices.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

The memory cells may be arranged in NAND strings that have non-volatile memory cells and select gates. A select gate may include one or more select transistors connected in series. A select gate at one end of the NAND string may be used to connect or disconnect the NAND string from a conductive line such as a bit line or a source line. The select gates may be used to select a NAND string of memory cells for a memory operation (e.g., read, write, erase). A select gate that connects/disconnects the NAND string to/from a bit line is sometimes referred to as a drain side select gate. A select gate that connects/disconnects the NAND string to/from a source line is sometimes referred to as a source side select gate. A select line is connected to control gates of select transistors of a set of NAND strings, in one technique. For example, a drain side select line may be connected to the control gates of drain side select transistors. Likewise, a source side select line may be connected to the control gates of source side select transistors.

BRIEF DESCRIPTION OF THE DRAWINGS

Like-numbered elements refer to common components in the different figures.

FIG. 3 is a perspective view of a memory device comprising a set of blocks in an example 3D configuration.

FIG. 4C depicts a logical representation of the conductive layers for the block that is partially depicted in FIG. 4A.

DETAILED DESCRIPTION

Figure 1:
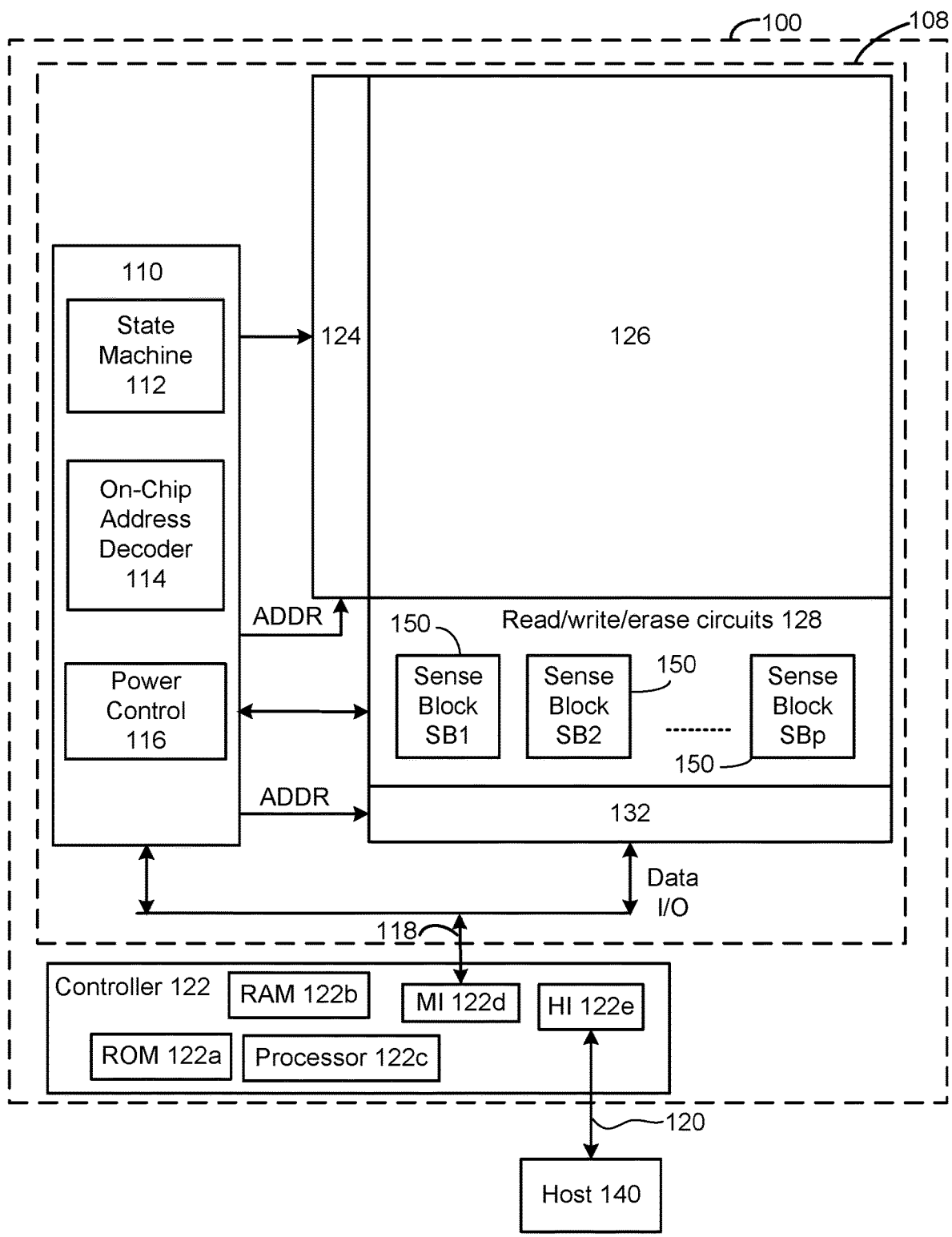
FIG. 1 is a functional block diagram of a memory device.

Techniques are provided for operating non-volatile storage. The non-volatile storage has NAND strings of memory cells, with each NAND string having non-volatile memory cells and select gates. In some embodiments, a NAND string has an operative select gate and a dummy select gate at one end of the NAND string. In some embodiments, a select gate has one or more select transistors. Thus, the operative select gate has one or more operative select transistors and the dummy select gate has one or more dummy select transistors, in an embodiment. The dummy select gate resides between the operative select gate and a bit line, in one embodiment. The operative select gate is used to connect/disconnect the NAND string to/from the bit line, in an embodiment. The dummy select transistor(s) are naturally conducting such that they are typically on (i.e., conducting), in an embodiment. Since the dummy select transistor(s) are typically on, they do not impact whether the NAND string is connected to or disconnected from the bit line, in an embodiment. Similar to how a drain side select line may be connected to the control gates of drain side select transistors of different NAND strings, a dummy line may be connected to control gates of the dummy select transistors of those NAND strings. There may optionally be a dummy select gate at the other end of the NAND string. For example, there may be a dummy select gate between a source side select gate and a source line.

During a memory operation (e.g., read, write), a voltage waveform may be applied to one end of a select line. For example, a driver that is connected to a "near end" of the select line may be used to apply the voltage waveform. The voltage waveform may be intended to control the state of the select transistors. For example, the voltage waveform may be intended to turn a select transistor on or off. Note that the voltage applied to either the bit line or source line may also determine whether the select transistor turns on or off. Thus, it may be that the voltage waveform is intended to turn some select transistors off, while others are on. Due to RC (resistive-capacitive) delay, there may be a delay for the voltage waveform to reach a "far end" end of the select line. In this context, the far end refers to the end of the select that that is away from the driver. The RC delay may delay when the state of the select transistor changes to its intended state. The amount of RC delay may vary from one select line to the next. In some embodiments, the voltage waveform is applied to both ends of the select line. Problems with RC delay may still occur when the voltage waveform is applied to both ends of the select line.

In one embodiment, the voltage on the dummy line is allowed to float during a memory operation, such as read or write ("write" may also be referred to as "program"). While the dummy line is floating, a voltage waveform is applied to the select line. Due to capacitive coupling between the select line and the dummy line, the floating voltage on the dummy line reacts to the voltage on the select line. In one embodiment, the floating voltage on the dummy line is monitored. The magnitude of the floating voltage is used to determine a condition of the voltage waveform at a target location on the select line, in an embodiment. This allows the select line voltage to be monitored in real-time, in an embodiment. By real-time monitoring of the select line voltage it is meant that a condition of the voltage waveform on the select line is determined in real-time (e.g., as it occurs).

In one embodiment, the target location on the select line is the far end of the select line. In one embodiment, a control circuit determines whether the select line has reached a ramp up voltage threshold at a target location on the select line based on the magnitude of the floating voltage on the dummy line. In one embodiment, a control circuit determines whether the select line has reached a ramp down voltage threshold at a target location on the select line based on the magnitude of the floating voltage on the dummy line.

The control circuit determines a condition of the operative select gates connected to a select line based on a magnitude of the floating voltage, in an embodiment. For example, the control circuit may determine whether operative select transistors have turned off or turn on in response to the voltage waveform, in one embodiment.

The control circuit determines when to apply a voltage to a word line based on the magnitude of the floating voltage on the dummy line, in an embodiment. For example, the control circuit may determine that operative select transistors on unselected NAND strings have turned off in response to the voltage waveform applied to the select line. Having the operative select gates on unselected NAND strings off is a condition for applying voltages to word line, in an embodiment. The control circuit may determine that, for example, a program voltage may be applied to a selected word line based on the magnitude of the floating voltage on the dummy line. The control circuit may control the timing of other voltages that are applied to word lines based on the magnitude of the floating voltage on the dummy line.

In some embodiments, the dummy select gates are used to assist in erasing the non-volatile memory cells. In some embodiments, a gate induced drain leakage (GIDL) current is used to charge up the NAND string channel, during an erase operation. An erase enable voltage is applied to control gates of the memory cells, while maintaining the NAND string channel potential to erase the memory cells. The GIDL current is generated by causing a drain-to-gate voltage at the select gates, in one embodiment. A transistor drain-to-gate voltage that generates a GIDL current is referred to herein as a GIDL voltage. The GIDL current may result when a select transistor drain voltage is significantly higher than the select transistor's control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells. In some embodiments, the channels of the dummy select transistors have high n+ doping to allow for good GIDL current generation during erase.

FIG. 1-FIG. 4E describe one example of a memory system that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. Also, many NAND strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, erase and others) on memory structure 126, and includes state machine 112, an on-chip address decoder 114, and a power control circuit 116. In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment.

State machine 112 and/or controller 122 (or equivalently functioned circuits), in combination with all or a subset of the other circuits depicted in FIG. 1, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
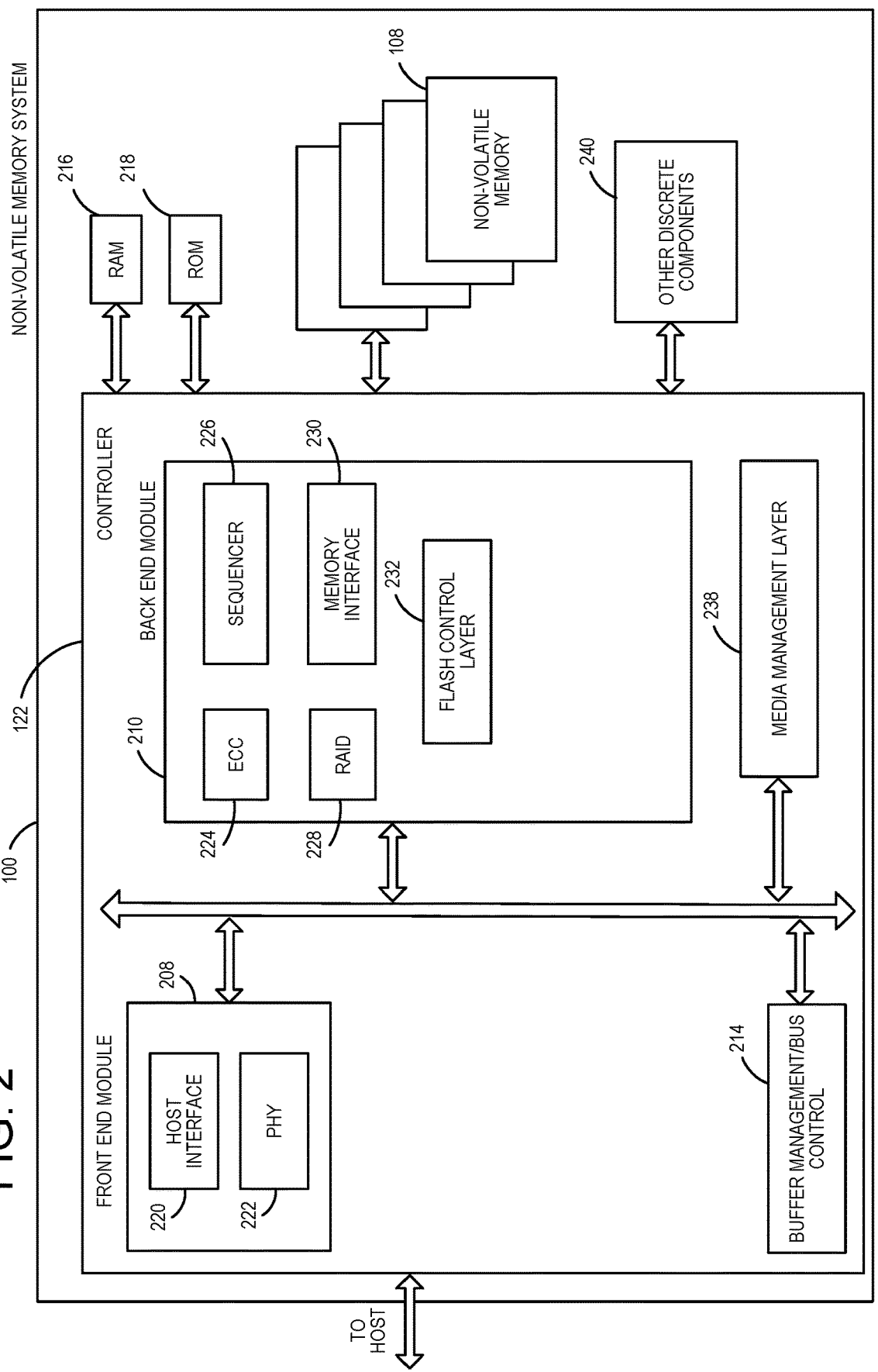
FIG. 2 is a block diagram depicting one embodiment of a memory system.

FIG. 2 is a block diagram of example memory system 100, depicting more details of one embodiment of controller 122. The controller in FIG. 2 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block. The MML 238 understands these potential limitations of the memory 126 which may not be visible to the host. Accordingly, the MML 238 attempts to translate the writes from host into writes into the memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

FIG. 3 is a perspective view of a portion of one example embodiment of a monolithic three dimensional memory array that can comprise memory structure 126, which includes a plurality non-volatile memory cells. For example, FIG. 3 shows a portion of one block comprising memory cells. The structure depicted includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. The select layers may include operational select layers and dummy select layers. More or fewer than 108-300 layers can also be used. The alternating dielectric layers and conductive layers are divided into four "fingers" or sub-blocks by local interconnects LI, in an embodiment. FIG. 3 shows two fingers and two local interconnects LI. Below the alternating dielectric layers and word line layers is a source line layer SL. Vertical columns of materials (also known as memory holes) are formed in the stack of alternating dielectric layers and conductive layers. For example, one of the vertical columns/memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 4A:
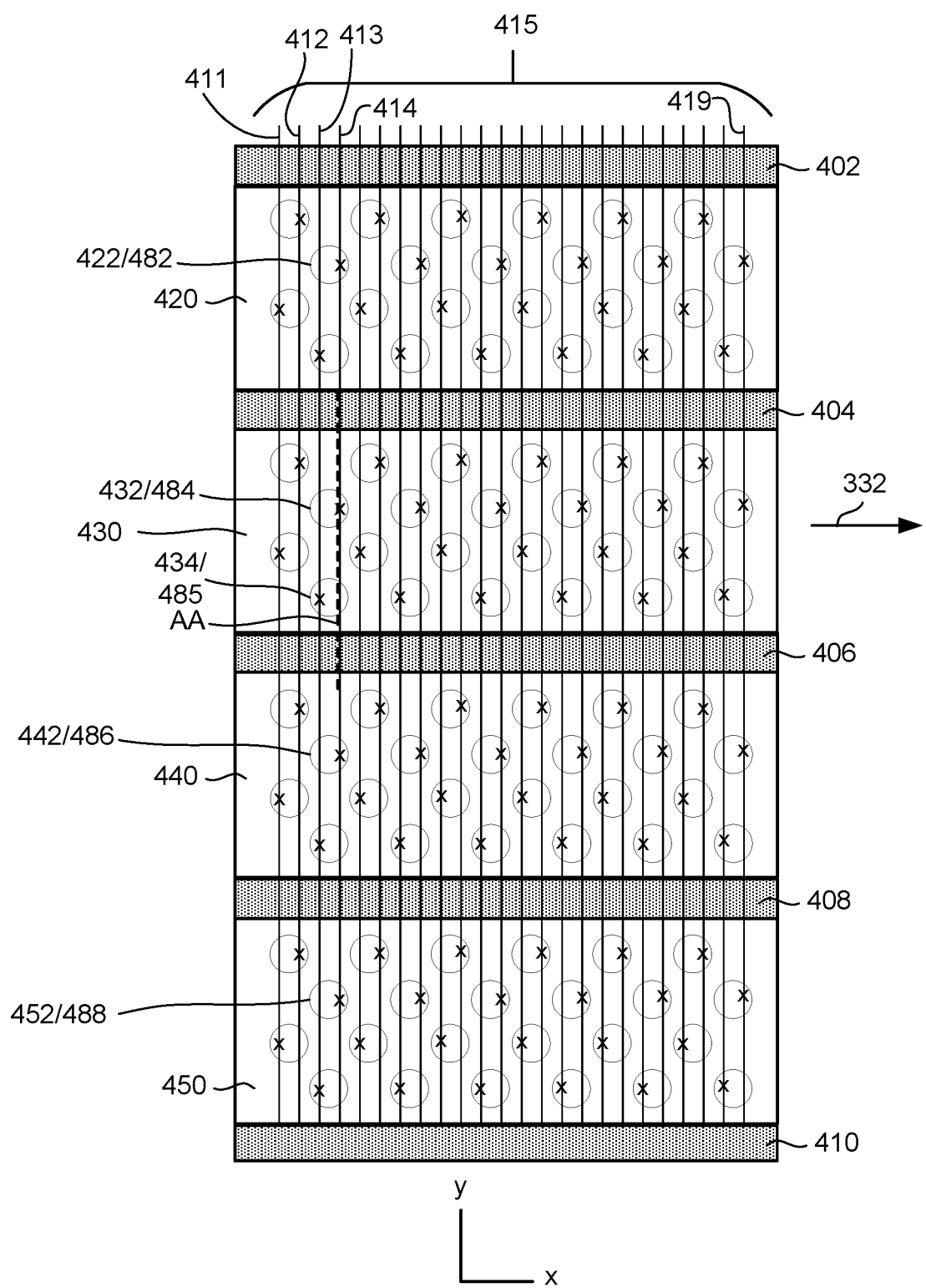
FIG. 4A is a block diagram depicting a top view of a portion of one block from memory structure 126.

FIG. 4A is a block diagram depicting a top view of a portion of one block from memory structure 126. As can be seen from FIG. 4A, the block extends in the direction of 332. In one embodiment, the memory array has many layers; however, FIG. 4A only shows the top layer.

FIG. 4A depicts a plurality of circles that represent the vertical columns. Each of the vertical columns include multiple select transistors (a select gate may include one or more select transistors) and multiple memory cells. Some of the select transistors are referred to herein as operative select transistors, and some are select transistors are referred to herein as dummy select transistors. In one embodiment, each vertical column implements a NAND string. For example, FIG. 4A depicts vertical columns 422, 432, 442 and 452. Vertical column 422 implements NAND string 482. Vertical column 432 implements NAND string 484. Vertical column 434 implements NAND string 485. Vertical column 442 implements NAND string 486. Vertical column 452 implements NAND string 488. More details of the vertical columns are provided below. Since the block depicted in FIG. 3D extends in the direction of arrow 332 and in the direction of arrow 332, the block includes more vertical columns than depicted in FIG. 4A.

FIG. 4A also depicts a set of bit lines 415, including bit lines 411, 412, 413, 414, ... 419. FIG. 4A shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452. In some embodiments, bit lines are positioned over the memory structure 126 and run along the entire length of the plane. Each bit line is connected to a vertical column in other blocks. For example, the bit lines are connected to vertical columns in Block 0, Block 1, Block 2, ... Block M−1 in a plane.

The block depicted in FIG. 4A includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4A is divided into regions 420, 430, 440 and 450, which are referred to as fingers or sub-blocks. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4A shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4A also shows the vertical columns being staggered. In other embodiments, different patterns of staggering can be used. In some embodiments, the vertical columns are not staggered.

Figure 4B:
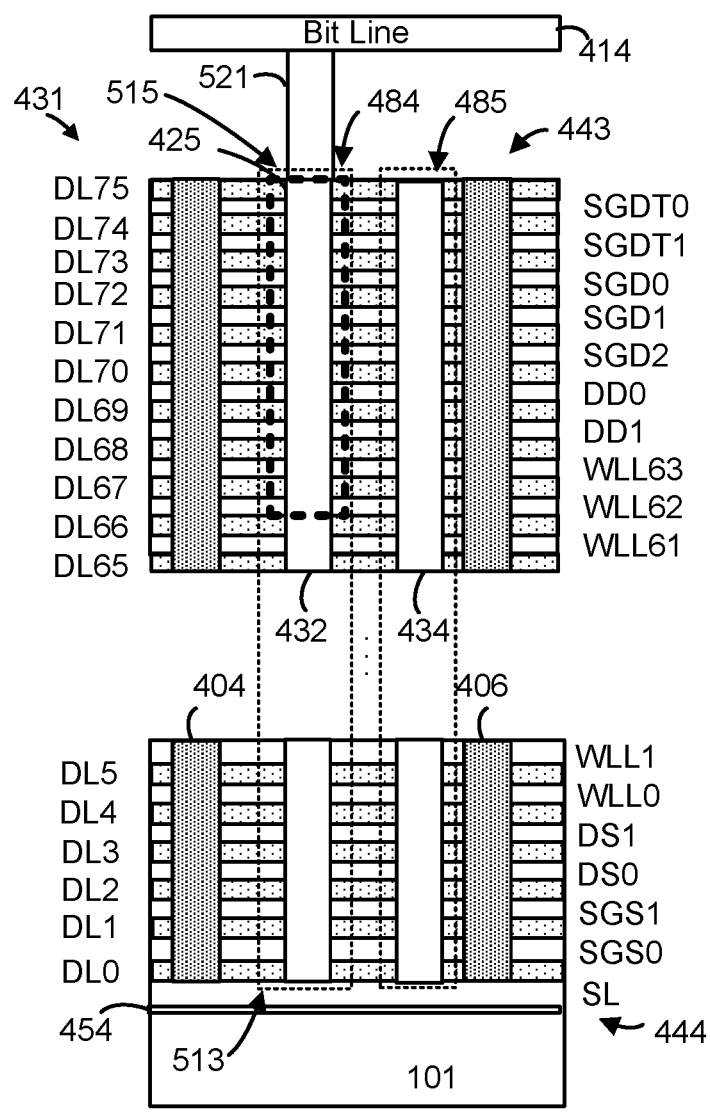
FIG. 4B depicts an example cross-sectional view along line AA in FIG. 4A.

FIG. 4B depicts an example cross-sectional view along line AA in FIG. 4A. The block comprises a stack 431 of alternating conductive and dielectric layers. In one embodiment, the conductive layers are made from a combination of TiN and Tungsten. In other embodiments, other materials can be used to form the conductive layers, such as doped polysilicon, metal such as Tungsten or metal silicide. In one embodiment, the dielectric layers are made from $SiO_2$. In other embodiments, other dielectric materials can be used to form the dielectric layers. The non-volatile memory cells are formed along vertical columns which extend through alternating conductive and dielectric layers in the stack. In one embodiment, the memory cells are arranged in NAND strings 484, 485.

In this example, the conductive layers comprise SGS layers (SGS0, SGS1), DS layers (DS0, DS1), WLL layers (WLL0-WLL63), DD layers (DD0, DD1), SGD layers (SGD0, SGD1, SGD2), and SGDT layers (SGDT0, SGDT1). The dielectric layers are labelled as DL0-DL75. Note that since FIG. 4B is a depiction along line AA in FIG. 4A, the following discussion pertains to region 430 in FIG. 4B. Region 430 may be referred to as a sub-block. The SGS layers are connected together to form a source side select line, in an embodiment. Each SGS layer could be a separate source side select line. The DS layers and the DD layers may each form a dummy word line, or may be connected with DS layers and the DD layers in other sub-blocks to form a dummy word line. The WLL layers may each form a word line, or may be connected with WLL layer in other sub-blocks to form a word line. The SGD layers are connected together to form a drain side select line, in an embodiment. Each SGD layer could be a separate drain side select line. The SGDT layers may be connected together to form a dummy select line (or more briefly as dummy line). Each SGDT layer is a separate dummy select line, in one embodiment. There may be more or fewer of each of the types of layers (SGS, DS, WLL, DD, SGD, SGDT). Optionally, there could be one or more layers for dummy select layers between the SGS0 layer and the source line (SL). The SL is separated from a substrate 101 by an insulator 454.

Further, regions of the stack which comprise NAND strings 484 and 485 are depicted. Each NAND string encompasses a memory hole 432 or 434 which is filled with materials which form memory cells adjacent to the word lines. A region 425 of the stack is shown in greater detail in FIG. 4E.

NAND string 484 has a source-end 513 at a bottom 444 of the stack 431 and a drain-end 515 at a top 443 of the stack. Metal-filled slits 404, 406 may be provided periodically across the stack as interconnects which extend through the stack, such as to connect the source line to a line above the stack. The slits may be used during the formation of the word lines and subsequently filled with metal. A portion of a bit line 414 is also depicted. A conductive via 521 connects the drain-end 515 of NAND string 484 to bit line 414.

In one approach, the block comprising memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 4C depicts a logical representation of the conductive layers (SGDT0, SGDT1 SGD0, SGD1, SGD2, DD0, DD1, WWL63-WLL0, DS1, DS0, SGS1, and SGS0) for the block that is partially depicted in FIG. 4A. The SGD layers SGD0, SGD1, and SGD2 each includes parallel rows of select gate regions associated with the drain-side of a set of NAND strings. For example, SGD0 includes drain-side select gate regions 447a, 449a, 451a, and 453a; SGD1 includes drain-side select gate regions 447b, 449b, 451b, and 453b; and SGD2 includes drain-side select gate regions 447c, 449c, 451c, and 453c. Drain-side select gate regions can be electrically connected to form a single drain-side select line. In one embodiment, regions 447a, 447b, and 447c are electrically connected to form a select line; regions 449a, 449b, and 449c are electrically connected to form a select line; regions 451a, 451b, and 451c are electrically connected to form a select line; and regions 453a, 453b, and 453c are electrically connected to form another select line. Thus, it will be understood that herein the definition of a select line is broad enough to include conductive regions at different levels of a stack 431, wherein the conductive regions are electrically connected together. In one embodiment local interconnects 402, 404, 406, 408 and 410 break up each conductive layer into four regions or fingers.

The SGDT layers SGDT0 and SGDT1 each includes parallel rows of dummy regions associated with the drain-side of a set of NAND strings. For example, SGDT0 includes drain-side dummy select gate regions 426a, 427a, 428a, and 429a. Likewise, SGDT1 includes drain-side dummy select gate regions 426b, 427b, 428b, and 429b. Dummy regions at SGDT0, can be independently controlled from dummy regions at SGDT1, in one approach. In this case, region 426a and region 426b could be considered to be separate dummy lines. Similar reasoning applied to the other regions 427, 428, 429. Or, the dummy regions in the same sub-block in can connected and commonly controlled. In this case, regions 426a and 426b are connected and form one dummy line, regions 427a and 427b are connected and form another dummy line; regions 428a and 428b are connected and form another dummy line; and regions 429a and 429b are connected and form still another dummy line.

Below the SGD layers are the drain-side dummy word line layers (DD0, DD1). Each dummy word line layer represents a dummy word line, in one approach, and is connected to a set of dummy memory cells at a given height in the stack. For example, DD0 comprises word line layer regions 461, 462, 463 and 464. A dummy memory cell, also referred to as a non-data memory cell, does not store data and is ineligible to store data, while a data memory cell is eligible to store data. Moreover, the Vth of a dummy memory cell is generally fixed at the time of manufacturer or may be periodically adjusted, while the Vth of the data memory cells changes more frequently, e.g., during erase and programming operations of the data memory cells.

Below the dummy word line layers are the data word line layers (WLL0-WLL63). For example, WLL623 comprises word line layer regions 465, 466, 467 and 468, consistent with FIG. 4A. Below the data word line layers are the source-side dummy word line layers DS1 and DS0.

Below the source-side dummy word line layers are the SGS layers (SGS1, SGS0). The SGS layers SGS0 and SGS1 each includes parallel rows of select gate lines associated with the source-side of a set of NAND strings. For example, regions 455a and 455b are connected together to form one source side select line; regions 456a and 456b are connected together to form another source side select line; regions 457a and 457b are connected together to form another source side select line; and regions 458a and 458b are connected together to form still another source side select line, in an embodiment. Or, the select gate regions at layers SGS1 and SGS can be independently controlled. For example, region 455a forms one independently controllable source side select line, and region 455b forms one independently controllable source side select line, in an embodiment. Optionally, there could be one or more layers for dummy select lines below the SGS0 layer.

Figure 4D:
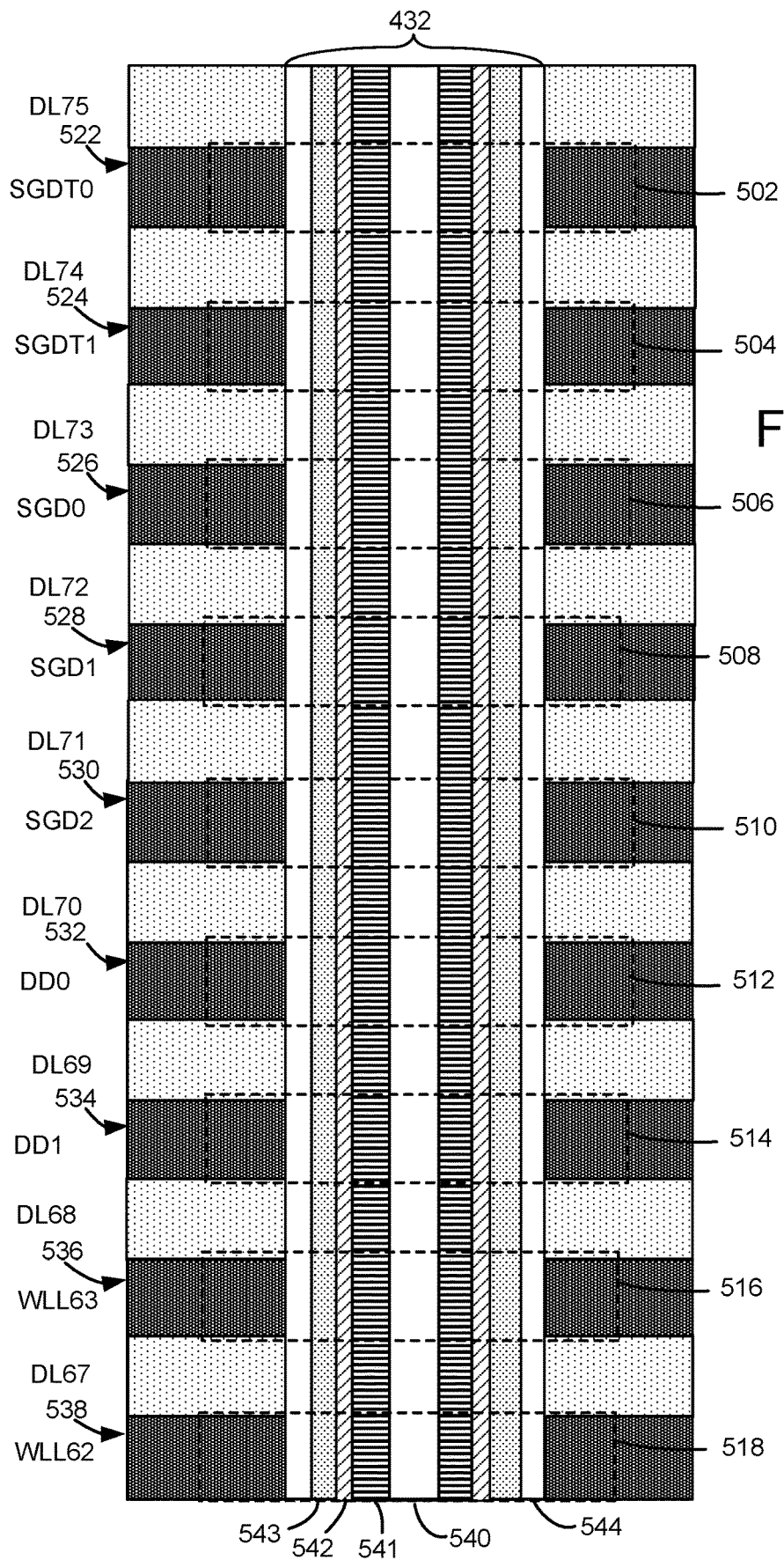
FIG. 4D depicts a close-up view of the region 425 of stack 431 of FIG. 4B.

FIG. 4D depicts a close-up view of the region 425 of stack 431 of FIG. 4B. FIG. 4D shows dielectric layers DL67-DL75, as well as word line layer WLL62, dummy word line layers DD1 and DD0, and drain side select layers SGD2, SGD1 and SGD0, as well as dummy select line layers SGDT1, SGDT0. Memory cells are formed at the different levels of the stack at the intersection of a word line layer and a memory hole 432. In this example, memory cell 516 is formed in WLL63, and memory cell 518 is formed in WLL62. Dummy memory cell 512 is formed in DD0, and dummy memory cell 514 is formed in DD1. Select gate transistors are formed at the different levels of the stack at the intersection of a select line layer and a memory hole 432. SGD transistor 506 is formed in SGD0, SGD transistor 508 is formed in SGD1, SGD transistor 510 is formed in SGD2. Dummy select gate transistors are formed at the different levels of the stack at the intersection of a dummy line layer and a memory hole 432. Dummy SGD transistor 502 is formed in SGDT0, dummy SGD transistor 504 is formed in SGDT1. The SGD transistor gate layers (SGD0, SGD1, SGD2) may be electrically connected to the same voltage source, in one embodiment. The dummy line layers (SGDT0, SGDT1) may be electrically connected to the same voltage source, in one embodiment.

A number of layers can be deposited along the sidewall (SW) of the memory hole 432 and/or within each word line layer, e.g., using atomic layer deposition. For example, each pillar or column which is formed by the materials within a memory hole 432 can include a blocking oxide/block high-k material 544, charge-trapping layer 543 or film such as silicon nitride ($Si_3N_4$) or other nitride, a tunneling layer 542, a channel 541, and a dielectric core 540. The channel 541 is formed from a semiconductor, such as, silicon, silicon germanium, etc. In one embodiment, the channel 541 is formed from a polycrystalline semiconductor. In one embodiment, the channel 541 is formed from a crystalline semiconductor. A word line layer can include a conductive metal such as Tungsten. A portion a word line layer that is adjacent to layer 544 is referred to as a control gate. For example, control gates 522, 524, 526, 528, 530, 532, 534, 536, 538 are provided. In this example, all of the layers except the metal are provided in the memory hole 432. In other approaches, some of the layers can be in the control gate layer. Additional pillars are similarly formed in the different memory holes. A pillar can form a columnar active area of a NAND string.

When a memory cell is programmed, electrons are stored in a portion of the charge-trapping layer which is associated with the memory cell. These electrons are drawn into the charge-trapping layer from the channel, and through the tunneling layer. The threshold voltage (Vth) of a memory cell is increased in proportion to the amount of stored charge. In one embodiment, during erase, holes tunnel from the channel to the charge trapping layer to recombine with electrons thereby decreasing the Vth of memory cells. These electrons are drawn into the charge trapping layer 543 from the channel 541, through the tunneling dielectric 542, in response to an appropriate voltage on word line region. The threshold voltage (Vth) of a memory cell may be increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Note that both data and dummy memory cells may be programmed In some embodiments, the dummy memory cells are erased, and stay in the erased state during operation of the memory array. Hence, dummy memory cells could have a low threshold voltage. Moreover, the dummy memory cells could have a significant number of holes in their charge trapping layer.

Also note that the select gate transistors can also be programmed in a manner similar to programming the memory cells, in some embodiments. In some embodiments, the select gate transistors are programmed to have a target threshold voltage for optimal memory array operation.

Figure 4E:
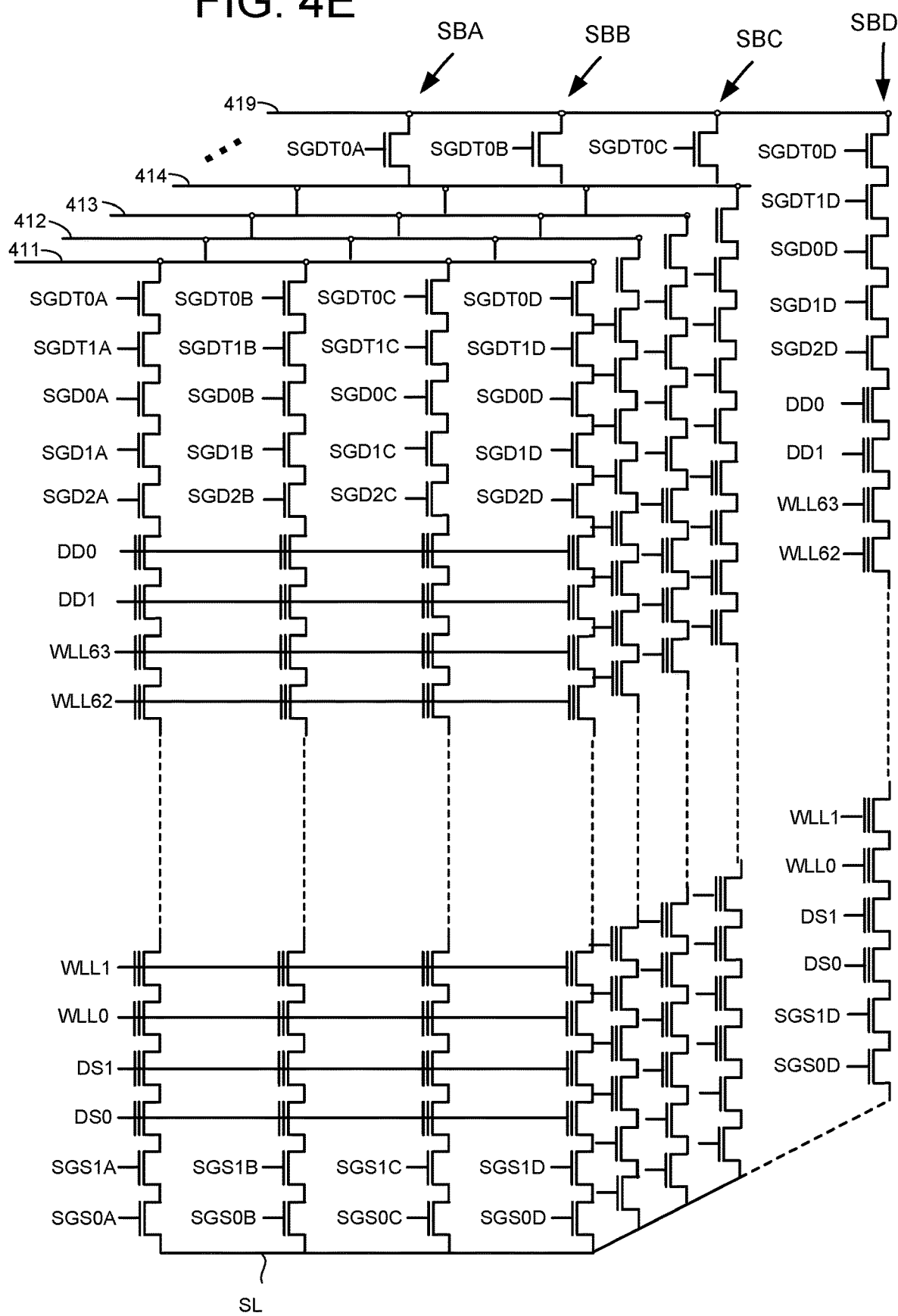
FIG. 4E shows a block that contains numerous NAND strings.

FIG. 4E shows a block that contains numerous NAND strings. The NAND strings are consistent with the examples of FIGS. 4B and 4D. The block contains various conductive layers that have been discussed in connection with FIGS. 4B-4D. The conductive layers are labeled, but not expressly shown. For example, word line layers WLL0-WLL63 each extend across the entire block. Likewise, dummy word line layers DS0, DS1, DD0 and DD1 each extend across the entire block. Bit lines 411, 412, 413, 414, . . . 419 are shown above the block (as in FIG. 4A). Within the block, each bit line connects to four NAND strings. Drain side selection lines SGD are used to determine which of the four NAND strings connect to the associated bit line. The block can also be thought of as divided into four sub-blocks SBA, SBB, SBC and SBD.

Sub-block SBA corresponds to those vertical NAND strings controlled by select lines SGD0A, SGD1A, SGD2A, SGS1A and SGS0A. Note that select lines SGD0A, SGD1A and SGD2A may have the same voltages applied thereto, in which case regions SGD0A, SGD1A and SGD2A may be considered to be a single select line. For example, select lines SGD0A, SGD1A and SGD2A may be connected electrically to form a single select line. Likewise, select lines SGS0A and SGS1A may have the same voltages applied thereto, in which case regions SGS0A and SGS1A may be considered to be a single select line. For example, select lines SGS0A and SGDSA may be connected electrically to form a single select line. NAND strings in sub-block SBA have dummy lines SGDT0A and SGDT1A.

Sub-block SBB corresponds to those vertical NAND strings controlled by select lines SGD0B, SGD1B, SGD2B, SGS1B and SGS0B. Note that select lines SGD0B, SGD1B and SGD2B may have the same voltages applied thereto in which case regions SGD0B, SGD1B and SGD2B may be considered to be a single select line. For example, select lines SGD0B, SGD1B and SGD2B may be connected electrically to form a single select line. Likewise, select lines SGS0B and SGS1B may have the same voltages applied thereto. For example, select lines SGS0B and SGDSB may be connected electrically to form a single select line. NAND strings in sub-block SBB have dummy lines SGDT0B and SGDT1B.

Sub-block SBC corresponds to those vertical NAND strings controlled by select lines SGD0C, SGD1C, SGD2C, SGS1C and SGS0C. Note that select lines SGD0C, SGD1C, and SGD2C may have the same voltages applied thereto. For example, select lines SGD0C, SGD1C, and SGD2C may be connected electrically to form a single select line. Likewise, select lines SGS0C and SGS1C may be controlled together. For example, select lines SGS0C and SGDSC may be connected electrically to form a single select line. NAND strings in sub-block SBC have dummy lines SGDT0C and SGDT1C.

Sub-block SBD corresponds to those vertical NAND strings controlled by select lines SGD0D, SGD1D, SGD2D, SGS1D and SGS0D. Note that select lines SGD0D, SGD1D, and SGD2D may have the same voltages applied thereto. For example, select lines SGD0D, SGD1D, and SGD2D may be connected electrically to form a single select line. Likewise, select lines SGS0D and SGS1D may be controlled together. For example, select lines SGS0D and SGS1D may be connected electrically to form a single select line. NAND strings in sub-block SBD have dummy lines SGDT0D and SGDT1D.

SGDT0A may correspond to region 426 in FIG. 4C. Likewise, each SGDT0B may correspond to region 427 in FIG. 4C. Likewise, each SGDT0C may correspond to region 428 in FIG. 4C. Likewise, each SGDT0D may correspond to region 428 in FIG. 4C. Likewise, each SGD0A may correspond to region 447 in FIG. 4C. Likewise, each SGD0B may correspond to region 449 in FIG. 4C. Likewise, each SGD0C may correspond to region 451 in FIG. 4C. Likewise, each SGD0D may correspond to region 453 in FIG. 4C. Likewise, each SGS0A may correspond to region 456 in FIG. 4C. Likewise, each SGS0B may correspond to region 456 in FIG. 4C. Likewise, each SGS0C may correspond to region 457 in FIG. 4C. Likewise, each SGS0D may correspond to region 458 in FIG. 4C.

Additionally note that various memory cells are depicted has having two "gates" in the schematic diagram of FIG. 4E. One of the memory cell gates is a control gate, the other "gate" refers to the charge trapping region 543. The select transistors are depicted as having a single gate to help show the distinction between the select gates and memory cells. Note that the select transistors may also have a charge trapping region. Moreover, this charge trapping material could be shared with the memory cells. For example, FIG. 4D shows charge trapping material 543 as a contiguous region shared by the memory cells 516, 518 and select transistors 506, 508, 510. The dummy select transistors (e.g., 502, 504) may also have this charge trapping material 543.

Figure 5A:
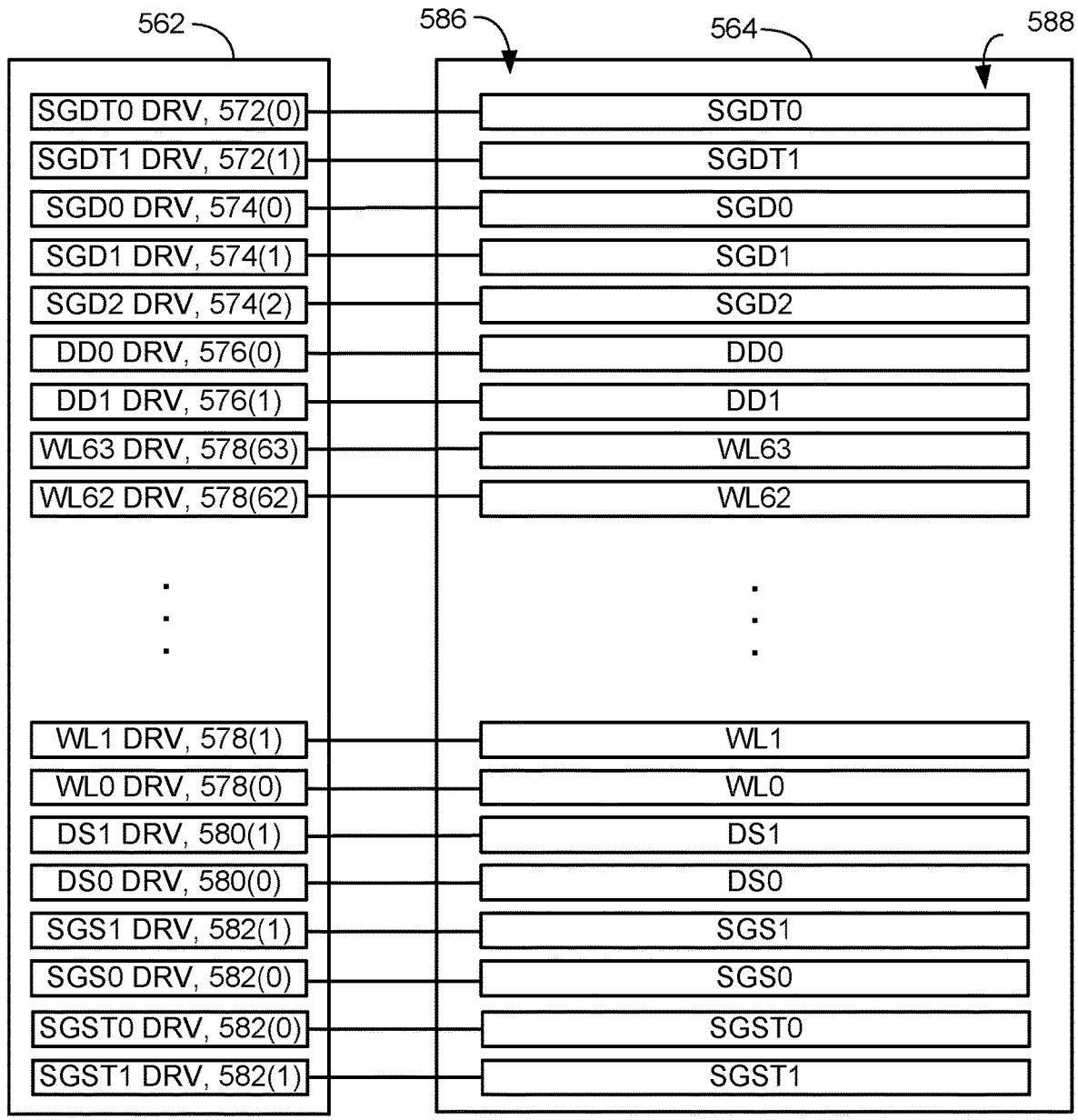
FIG. 5A is a diagram of one embodiment of drivers used to provide voltages to conductive lines in a block.

FIG. 5A is a diagram of one embodiment of drivers 562 used to provide voltages to conductive lines in a block 564. SDGT0 DRV 572(0) is connected to dummy line SGDT0. SDGT1 DRV 572(1) is connected to dummy line SGDT1. SDG0 DRV 574(0) is connected to drain side select line SGD0. SDG1 DRV 574(1) is connected to drain side select line SGD1. SDG2 DRV 574(2) is connected to drain side select line SGD2. SDST0 DRV 582(0) is connected to dummy line SGST0. SDST1 DRV 582(1) is connected to dummy line SGST1. SDS0 DRV 582(0) is connected to source side select line SGS0. SDS1 DRV 582(1) is connected to source side select line SGS1. The NAND strings are not depicted in FIG. 5A, but may extend from the top to the bottom of the block. Thus, in one embodiment, there are dummy lines at each end of the NAND strings. In one embodiment, there are dummy lines at the drain side (e.g., SGDT0, SGDT1) but there are not any dummy lines at the source side (e.g., SGST0 and SGST1 are not present). In one embodiment, there are dummy lines at the source side (e.g., SGST0 and SGST1) but there are not any dummy lines at the drain side (e.g., SGDT0 and SGDT1 are not present).

Also depicted are drivers for dummy word lines and data word lines. DD0 DRV 576(0) is connected to DD0, DD0 DRV 576(1) is connected to DD1, WL63 DRV 578(63) is connected to WL63, WL63 DRV 578(62) is connected to WL62, WL1 DRV 578(1) is connected to WL1, WL0 DRV 578(0) is connected to WL0, DS1 DRV 580(1) is connected to DS1, and DS0 DRV 580(0) is connected to DS0. Some of the word lines and word line drivers are not depicted in FIG. 5A.

The various conductive lines each have a first end 586 and a second end 588. The first end 586 is the end closest to the drivers 562, and in this example may be referred to as a "near end" of the conductive line. The second end 588 is the end farthest from the drivers 562, and in this example may be referred to as a "far end" of the conductive line.

Figure 5B:
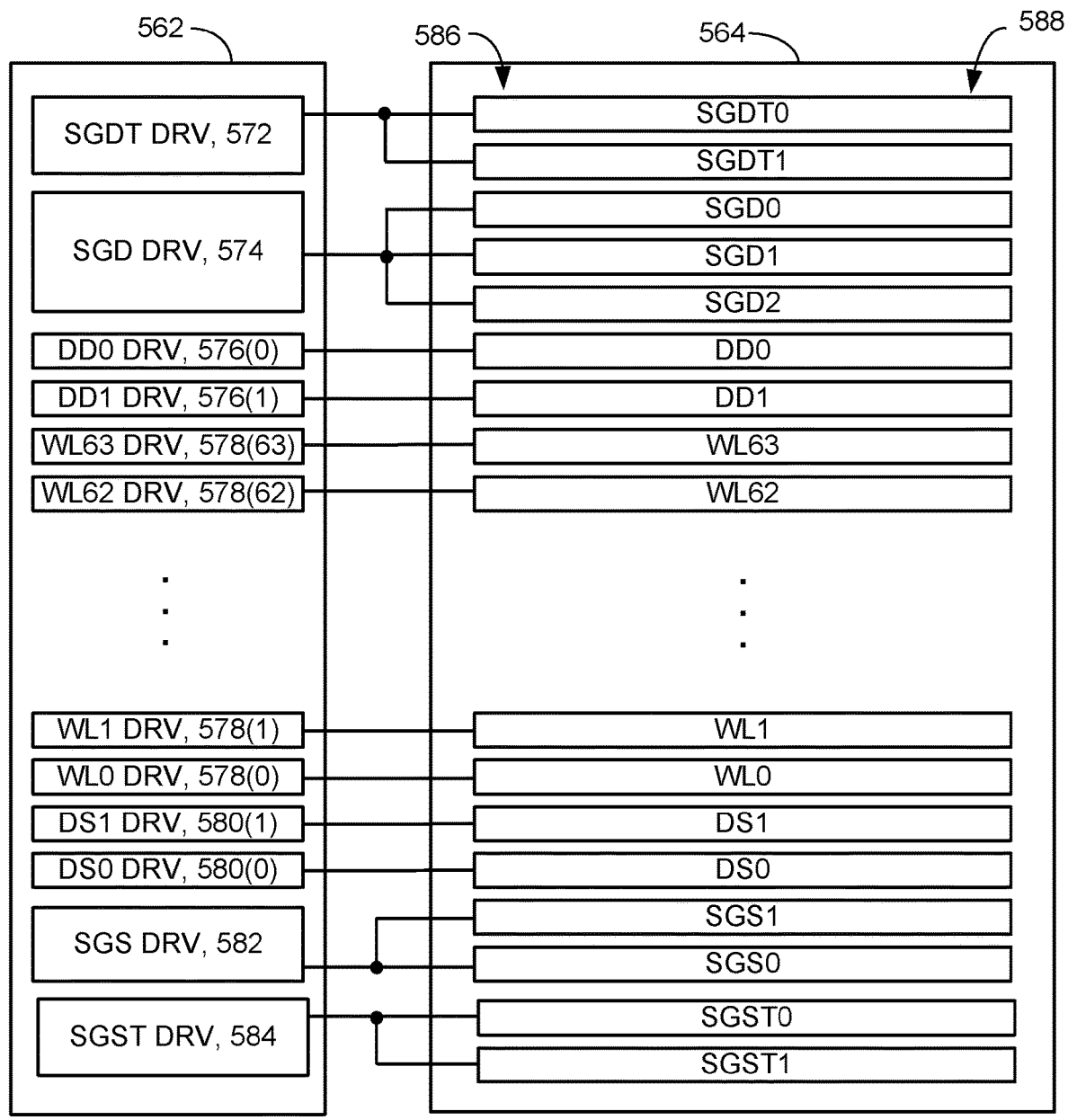
FIG. 5B depicts an alternative embodiment in which some of the dummy lines and select lines are connected together, such that one driver may provide the voltage for more than one conductive line.

FIG. 5B depicts an alternative embodiment in which some of the dummy lines and select lines are connected together, such that one driver may provide the voltage for more than one conductive line. SGDT0 DRV 572 is connected to both dummy line SGDT0 and dummy line SGDT1. SGD DRV 574 is connected to select line SGD0, select line SGD1, and select line SGD2. SGS DRV 582 is connected to select line SGS0 and select line SGS1. Stated another way, dummy line SGDT0 and dummy line SGDT1 are electrically connected to form a single dummy line. Likewise, select line SGD0, select line SGD1, and select line SGD2 are connected together to form a single select line.

Figure 5C:
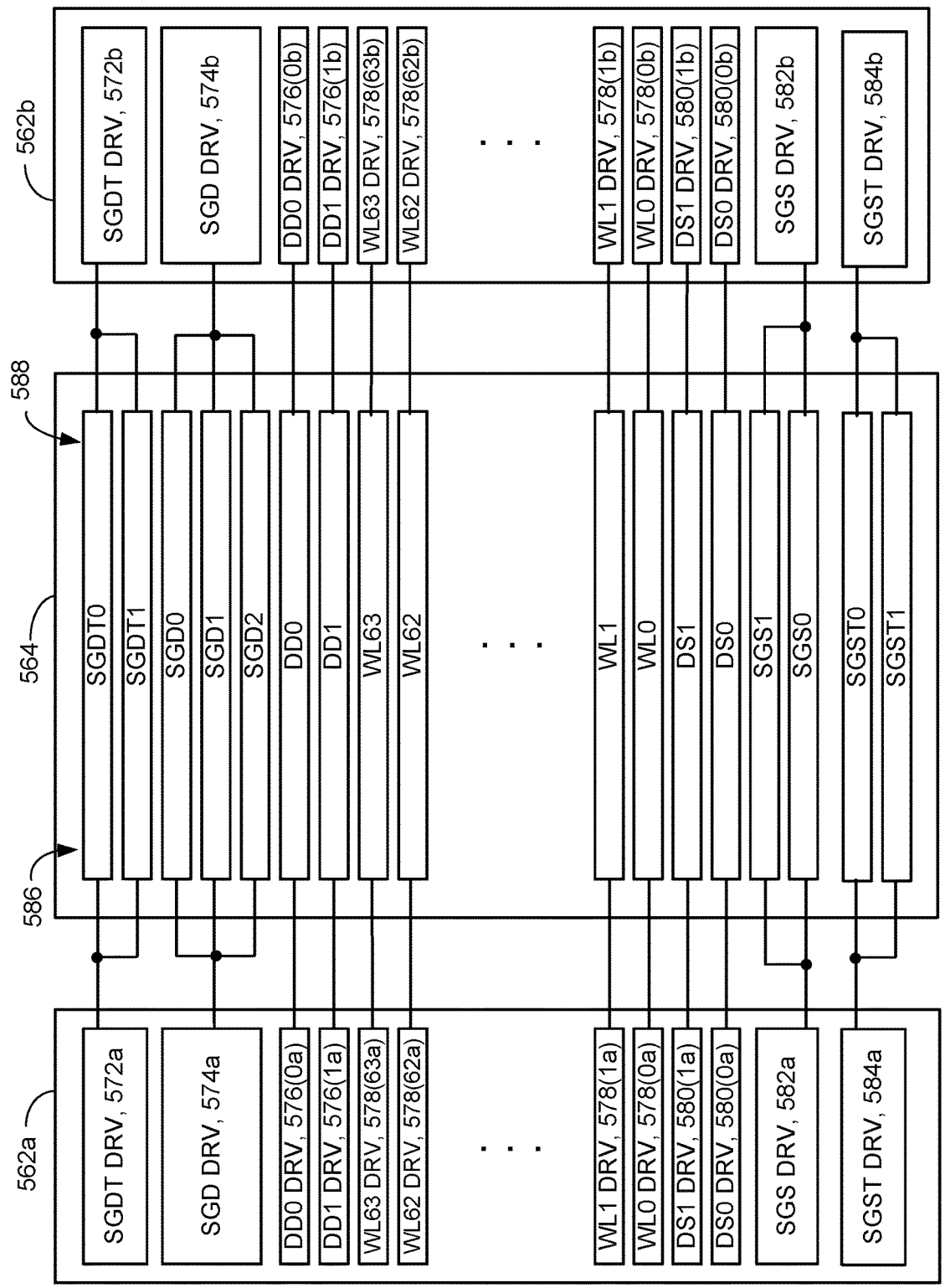
FIG. 5C depicts an alternative embodiment in which there is a first set of drivers adjacent to a first end of the conductive lines, and a second set of drivers adjacent to a second end of the conductive lines.

In some embodiments, there is a driver at each end (586, 588) of a conductive line. FIG. 5C depicts an alternative embodiment in which there is a first set of drivers 562a adjacent to a first end 586 of the conductive lines, and a second set of drivers 562b adjacent to a second end 588 of the conductive lines. SGDT DRV 572a is connected to a first end 586 of both dummy line SGDT0 and dummy line SGDT1 (SGDT0 and SGDT1 may be considered to be a single dummy line). SGDT DRV 572b is connected to a second end 588 of both dummy line SGDT0 and dummy line SGDT1. SGD DRV 574a is connected to a first end 586 of select line SGD0, select line SGD1, and select line SGD2 (select line SGD0, select line SGD1, and select line SGD2 may be considered to be a single select line). SGD DRV 574b is connected to a second end 588 of select line SGD0, select line SGD1, and select line SGD2. SGS DRV 582a is connected to a first end 586 of select line SGS0 and select line SGS1. SGS DRV 582b is connected to a second end 588 of select line SGS0 and select line SGS1.

FIG. 5C also depicts DD0 DRV 576(0a) is connected to first end 586 of DD0, DD0 DRV 576(1a) is connected to first end 586 of DD1, WL63 DRV 578(63a) is connected to first end 586 of WL63, WL63 DRV 578(62a) is connected to first end 586 of WL62, WL1 DRV 578(1a) is connected to first end 586 of WL1, WL0 DRV 578(0a) is connected to first end 586 of WL0, DS1 DRV 580(1a) is connected to first end 586 of DS1, and DS0 DRV 580(0a) is connected to first end 586 of DS0.

FIG. 5C also depicts DD0 DRV 576(0b) is connected to second end 588 of DD0, DD0 DRV 576(1b) is connected to second end 588 of DD1, WL63 DRV 578(63b) is connected to second end 588 of WL63, WL63 DRV 578(62b) is connected second end 588 of WL62, WL1 DRV 578(1b) is connected to second end 588 of WL1, WL0 DRV 578(0b) is connected to second end 588 of WL0, DS1 DRV 580(1b) is connected to second end 588 of DS1, and DS0 DRV 580(0b) is connected to second end 588 of DS0.

SGDT DRV 584a is connected to a first end 586 of both dummy line SGST0 and dummy line SGST1 (SGST0 and SGST1 may be considered to be a single dummy line).

SGST0 DRV 584*b* is connected to a second end 588 of both dummy line SGST0 and dummy line SGDS1. SGS DRV 582*a* is connected to a first end 586 of select line SGS0, select line SGS1, and select line SGS2 (select line SGS0, select line SGS1, and select line SGS2 may be considered to be a single select line). SGS DRV 582*b* is connected to a second end 588 of select line SGS0, select line SGS1, and select line SGS2.

Other variations in addition to those depicted in FIGS. 5A-5C are possible. For example, the embodiment of FIG. 5C can be modified such that the dummy lines are not connected together (similar to FIG. 5A). As another example, the embodiment of FIG. 5C can be modified such that the select lines are not connected together (similar to FIG. 5A). Also, it is not required that there are dummy lines at each end of the block 564. Each of the architectures in FIGS. 5A-5C can be modified to remove either the dummy lines on the drain end (e.g., SGDT0, SGDT1) or the dummy lines on the source end (e.g., SGST0, SGST1).

Figure 6:
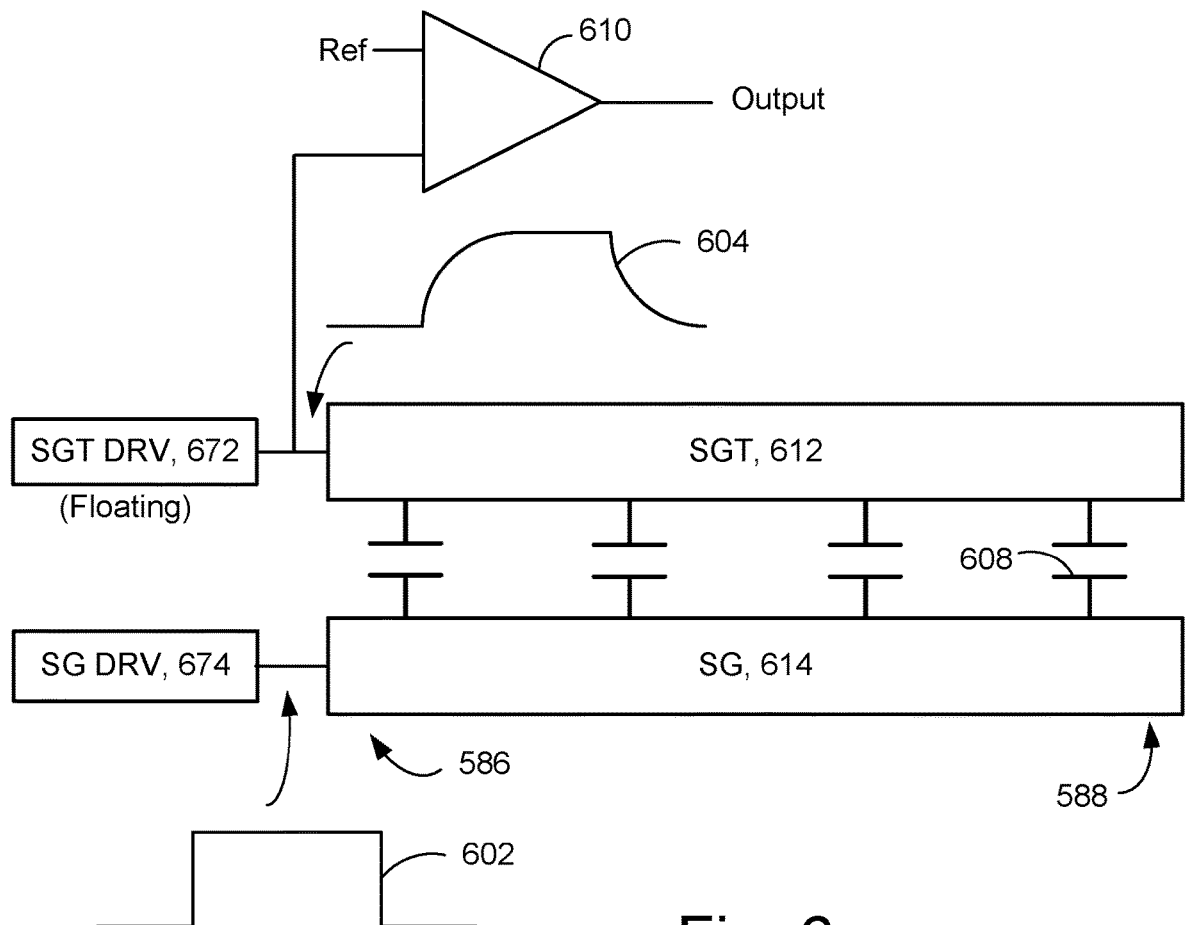
FIG. 6 is a diagram of one embodiment of an apparatus for determining a condition of a voltage waveform on a select line.

FIG. 6 is a diagram of one embodiment of an apparatus for determining a condition of a voltage waveform on a select line. In one embodiment, select line driver SG DRV 674 is used to apply voltage waveform 602 to a first end 586 of the select line SG 614. There may be some RC delay associated with the select line SG 614 that impacts voltage waveform 602. In one embodiment, the apparatus is used to determine a condition of the voltage waveform 602 at a target location on the select line SG 614. For example, the apparatus may determine when the voltage waveform 602 has reached a ramp up voltage threshold at the target location on the select line. As another example, the apparatus may determine when the voltage waveform 602 has reached a ramp down threshold voltage at the target location on the select line. The target location is the second end 588 of the select line SG 614, in an embodiment. The magnitude of the voltage waveform 602 may impact whether select transistors along the select line SG 614 turn on or turn off. In one embodiment, the apparatus may determine when select transistors along the select line SG 614 turn on or turn off. As will be explained in more detail below, the apparatus may make such determinations based on a floating voltage 604 that it senses on the dummy line SGT 612.

FIG. 6 depicts a dummy line SGT 612 adjacent to a select line SG 614. The dummy line SGT 612 is an immediate neighbor to the select line SG 614. The select line SG could be on the drain side (e.g., SGD) of the NAND strings or the source side (e.g., SGS) of the NAND strings. The dummy line could represent a single dummy line, or multiple dummy lines that are connected together. Likewise, the select line could represent a single select line, or multiple select lines that are connected together. For example, with respect to the example of FIG. 5A, the select line SG could be select line SGD0, the dummy line SGT could be dummy line SGDT1, the select line driver SG 674 could be SGD0 DRV 574(0), and the dummy line driver SGT 672 could be SGDT1 DRV 572(1). As another example, with respect to the example of FIG. 5A, the select line SG could be select line SGS0, the dummy line SGT could be dummy line SGST0, the select line driver SG 674 could be SGS0 DRV 582(0), and the dummy line driver SGT 672 could be SGDT0 DRV 582(0). As still another example, with respect to the example of FIG. 5B, the select line SG 614 could represent the combination of SGD0, SGD1, and SGD2; the dummy line SGT 612 could represent the combination of SGDT1 and SGDT0; the select line driver SG 674 could be SGD DRV 574; and the dummy line driver SGT 672 could be SGDT DRV 572. As still another example, with respect to the example of FIG. 5B, the select line SG 614 could represent the combination of SGS0 and SGS1; the dummy line SGT 612 could represent the combination of SGST1 and SGST0; the select line driver SG 674 could be SGS DRV 582; and the dummy line driver SGT 672 could be SGST DRV 582.

The select line driver SG DRV 674 provides a voltage waveform 602 to the select line SG 614. In this example, SGD DRV 674 provides the voltage waveform 602 to the first end 586 of the select line SG 614. Voltage waveform 602 represents a shape of the waveform that is output by the SG DRV 674. Due to an RC delay, the waveform will have a different shape at the second end 588 of the select line SG 614. For example, the select line SG 614 will have resistance between the first end 586 and the second end 588. Also, there will be some capacitive coupling between the select line SG 614 and other conductive elements, such as the dummy line SGT 614, as well as an immediate neighboring dummy word line (e.g., DD0 or DS0). Herein, an immediately neighboring line means that there are no intervening lines between the two lines.

While the select line driver SG DRV 674 provides voltage waveform 602 to the select line SG 614, the voltage on the dummy line 612 floats. Thus, dummy line driver SGT DRV 672 is operated such that the voltage on the dummy line 612 floats. Due to capacitive coupling between the select line SG 614 and the dummy line SGT 612, the voltage on the dummy line 612 will float up or down in response to the voltage on the select line 614. Capacitors 608 represent the capacitive coupling between the select line SG 614 and the dummy line SGT 612. Capacitors 608 represent what is typically referred to as a "parasitic capacitance." The parasitic capacitance may be greater if the spacing between the select line SG 614 and the dummy line SGT 612 is smaller. Thus, the RC delay may be greater as the technology advances, and the spacing decreases.

Waveform 604 represents the voltage at the first end 586 of SGT 612, in one embodiment. As noted, the voltage on the dummy line SGT 612 is a floating voltage. Hence, waveform 604 may be referred to as floating voltage 604. Floating voltage 604 is input to the comparator 610, such that the magnitude of floating voltage 604 may be compared to a reference voltage (REF). The output of the comparator 610 indicates whether the magnitude of floating voltage 604 is greater than or less than the reference voltage. In some embodiments, the apparatus determines a condition of the voltage waveform 602 at a target location on the select line SG 614 based on the output of comparator 610. For example, the apparatus may determine that the voltage waveform 602 (at the second end 588 of the select line SG 614) has ramped up to a target level based on the output of comparator 610. As another example, the apparatus may determine that the voltage waveform 602 (at the second end 588 of the select line SG 614) has ramped down to a target level based on the output of comparator 610. In effect, the apparatus may determine whether the select line SG 614 has charged or discharged in response to the voltage waveform 602 applied by the SG DRV 674.

Figure 7:
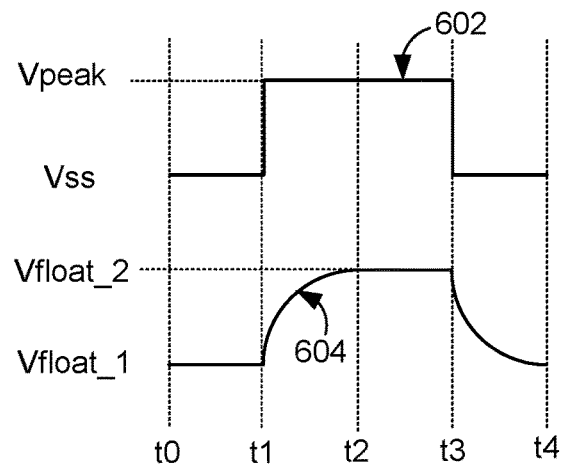
FIG. 7 depicts an example voltage waveform and an example floating voltage.

The shape of the floating voltage 604 is not exactly the same as the shape of voltage waveform 602. With reference to FIG. 7, voltage waveform 602 has a pulse shape, in one embodiment. The voltage waveform 602 increases rapidly at time t1 from a steady state voltage (Vss) to a peak voltage (Vpeak). The voltage waveform 602 stays at Vpeak until time t3, in this example. At time t3, the voltage waveform 602 decreases rapidly back to Vss. FIG. 7 depicts one possible way for the floating voltage 604 to respond to the voltage waveform 602 applied to the first end 586 of the select line SG 614. The floating voltage 604 is at a first floating voltage Vfloat_1 at time t0. At time t1, the floating voltage 604 begins to rise in response due to capacitive coupling between the floating dummy line SGT 612 and the select line SG 614. The floating voltage 604 increases to a second floating voltage Vfloat_2 by time t2. The floating voltage 604 increases at a slower rate than the voltage waveform 602 increases. The floating voltage 604 may hold at Vfloat_2 until time t3. After time t3, the floating voltage 604 decreases down to Vfloat_1, which is reached at time t4. The floating voltage 604 decreases at a slower rate than the voltage waveform 602 decreases. Note that Vpeak-Vss may be larger than Vfloat_2-Vfloat_1. The capacitive coupling ratio between the select line SG 614 and the dummy line SGT 612 impacts how much the voltage on the dummy line SGT 612 changes. Assuming that Vss and Vfloat_1 are each 0V for ease of discussion, then Vfloat_2 could be about 60% of Vss if the capacitive coupling ratio is 0.6. The capacitive coupling ratio could be higher or lower than 0.6.

Figure 8:
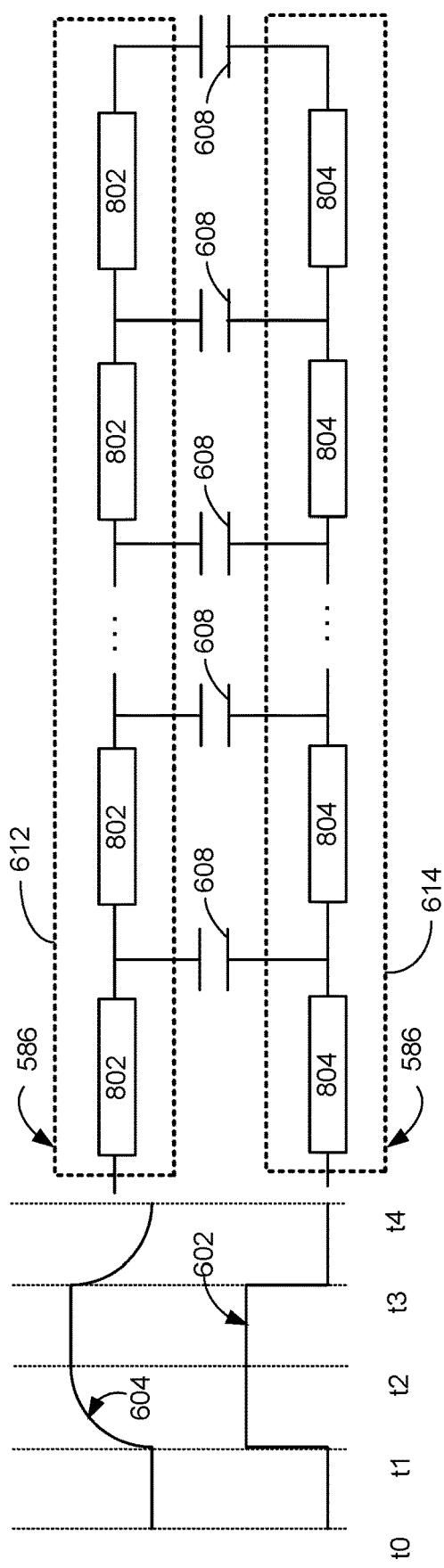
FIG. 8 depicts an equivalent circuit of a select line and a dummy line.

FIG. 8 depicts an equivalent circuit of the select line 614 and dummy line 612. The equivalent circuit shows a number of resistors 802, which represent resistance along the dummy line 612. The equivalent circuit shows several resistors 804, which represent resistance along the select line 614. In some embodiments, the size of the memory holes is not constant from the top to the bottom of the stack. For example, with reference to FIG. 4D, the memory hole 432 may have a greater diameter at the top (near the select transistors) than at the bottom. This may translate to a greater resistance at the SGD layers than at lower layer. Thus, this may be a factor in greater RC delay for SGD layers than for word line layers. Capacitors 608 represent parasitic capacitance between the select line 614 and the dummy line 612. As noted above, the parasitic capacitance may be greater if the spacing between the select line SG 614 and the dummy line SGT 612 is smaller Thus, the RC delay may be greater as the technology advances, and the spacing between the select line 614 and the dummy line 612 decreases. Voltage waveform 602 is shown being applied to the first end 586 of the select line 614. The floating voltage 604 is depicted at the first end 586 of the dummy line 612.

Note that the resistance of the select line 614, as well as the amount of parasitic capacitance 608 may vary from one block to the next. There could be variations from block 564 to block 564 or from memory die 108 to memory die 108 due to, for example, variations in the process of fabricating the memory structure 126. Thus, the amount of RC delay could vary from one select line to the next. This variance can impact the time when the select line 614 has been fully charged or fully discharged in response to the voltage waveform 604. In this context, fully charged means that all points on the select line 614 have reached their respective maximum voltage in response to the voltage waveform 602. In this context, fully discharged means that all point on the select line 614 has reached their respective lowest voltage in response to the voltage waveform 602.

Figure 9:
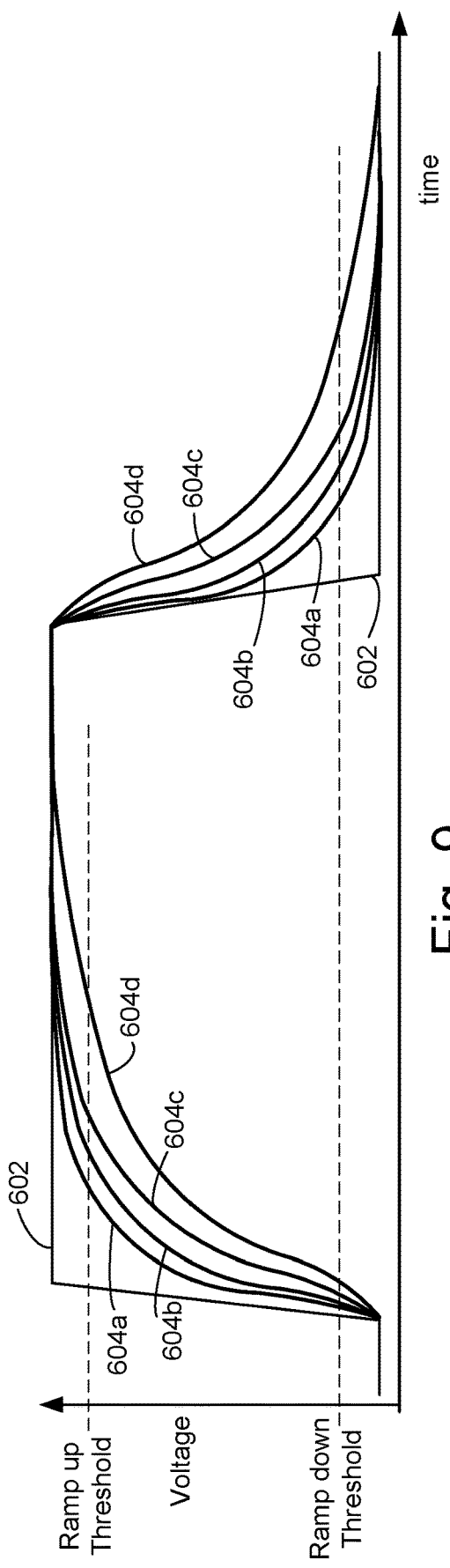
FIG. 9 depicts an example voltage waveform and several example floating voltages that correspond to different amounts of RC delay.

FIG. 9 depicts an example voltage waveform 602 and several example floating voltages 604a, 604b, 604c, 604d. The example voltage waveform 602 is applied to a first end 586 of the select line SG 614. The floating voltages 604a-604d are examples of floating voltages 604 on the dummy line SGT 612. The floating voltages 604a-604d correspond to cases for differing amounts of RC delay on the select line SG 614. Floating voltage 604a corresponds to a case with the least amount of RC delay on the select line SG 614 of the depicted cases. Floating voltage 604d corresponds to a case having the most amount of RC delay on the select line SG 614 of the depicted cases. Note that each floating voltage 604a-604d takes a different amount of time to reach the target threshold. For example, floating voltage 604d, which corresponds to the case with the greatest RC delay on the select line 614, takes the longest time to reach a ramp up threshold of the depicted cases. In contrast, floating voltage 604a, which corresponds to the case with the least amount RC delay on the select line 614, takes the shortest time to reach the ramp up threshold of the depicted cases. Likewise, floating voltage 604d takes the longest time to reach a ramp down threshold of the depicted cases. In contrast, floating voltage 604a takes the shortest time to reach the ramp down threshold of the depicted cases. Significantly, there is a correspondence between the amount of time that the floating voltage 604 takes to reach the target threshold (e.g., ramp up threshold, ramp down threshold) and the amount of RC delay on the select line SG 614. One factor in the differences in RC delay is the resistance of the select line SG 614. There may be considerable differences in the resistance of select lines SG 614 in different blocks or different memory die. There may also be significant differences in parasitic capacitance 608 in different blocks or different memory die.

Referring back to FIG. 6, the reference voltage that is input to the comparator 610 can be set based on the target threshold (e.g., ramp up threshold, ramp down threshold). For example, the reference voltage may be equal to the target threshold. The ramp up threshold is set at an appropriate level such that the floating voltage reaching the ramp up target threshold is an indication that the select line 612 is fully charged, in an embodiment. The ramp down threshold is set at an appropriate level such that the floating voltage reaching the ramp down target threshold is an indication that the select line 612 is fully discharged, in an embodiment.

Figure 10:
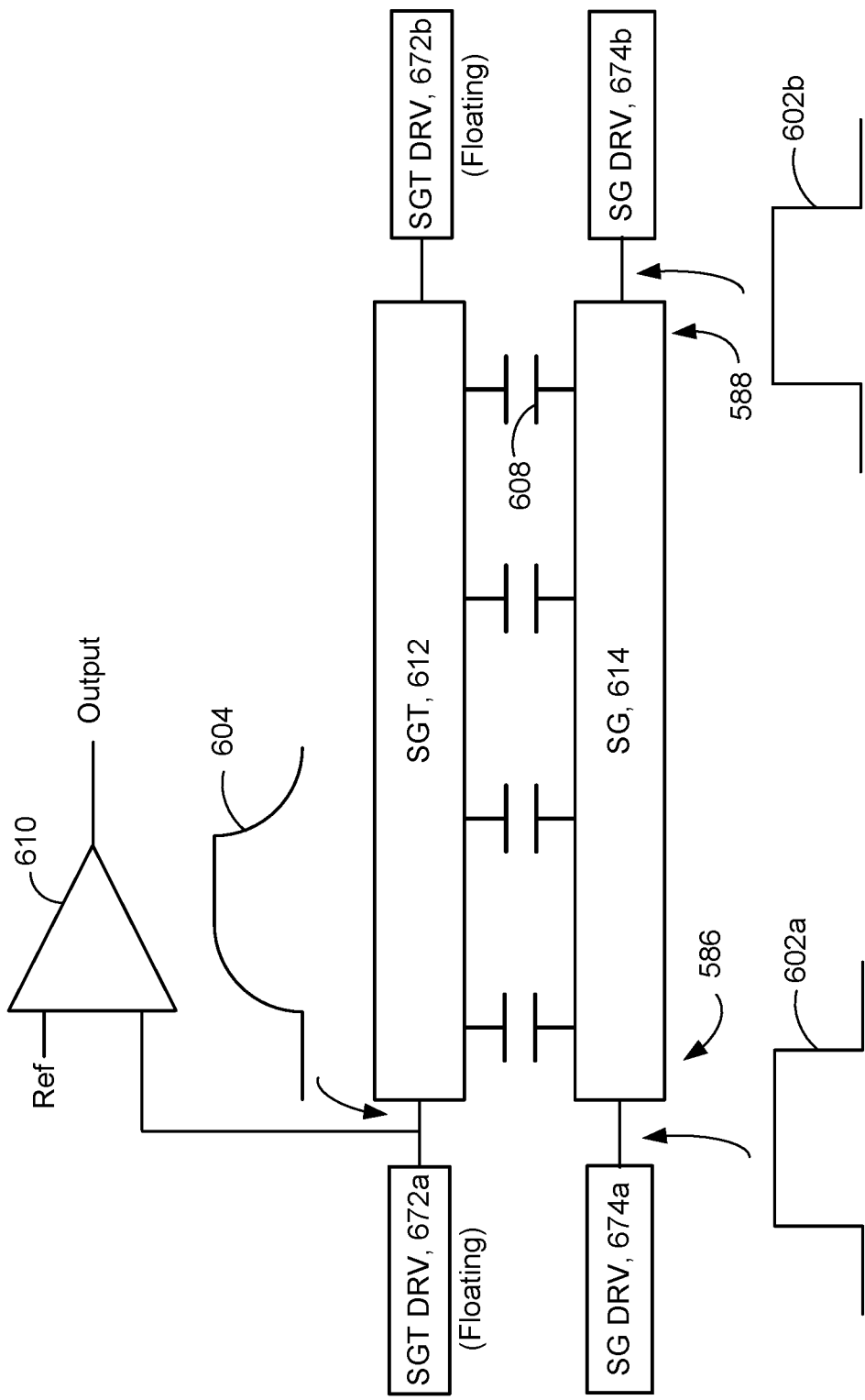
FIG. 10 is a diagram of one embodiment of an apparatus for detecting a condition of a voltage waveform on a select line.

The floating voltage on the dummy line SGT 612 may also be sensed for embodiments in which the select line SG 614 is driven from both ends. FIG. 10 is a diagram of one embodiment of an apparatus for detecting a condition of a voltage waveform 602 on a select line SG 614. FIG. 10 depicts the dummy line SGT 612 adjacent to the select line SG 614. The select line SG 614 could be on the drain side (e.g., SGD) of the NAND strings or the source side (e.g., SGS) of the NAND strings. The dummy line SGT 612 could represent a single dummy line, or multiple dummy lines that are connected together. Likewise, the select line could represent a single select line, or multiple select lines that are connected together. For example, with respect to the example of FIG. 5C, the select line SG 614 could represent the combination of select lines SGD0, SGD1, and SGD2; the dummy line SGT 612 could represent the combination of dummy lines SGDT1 and SGDT0; the select line driver SG 674a could be SGD DRV 574a; the select line driver SG 674b could be SGD DRV 574b, the dummy line driver SGT 672a could be SGDT DRV 572a, and the dummy line driver SGT 672b could be SGDT DRV 572b. As another example with respect to the example of FIG. 5C, the select line SG 614 could represent the combination of select lines SGS0 and SGS; the dummy line SGT 612 could represent the combination of dummy lines SGST1 and SGST0; the select line driver SG 674a could be SGS DRV 582a; the select line driver SG 674b could be SGS DRV 582b, the dummy line driver SGT 672a could be SGST DRV 584a, and the dummy line driver SGT 672b could be SGST DRV 584b.

Select line driver SG DRV 674a provides a voltage waveform 602a to first end 586 of the select line SG 614. Select line driver SG DRV 674b provides a voltage waveform 602b to second end 588 of the select line SG 614.

Voltage waveform 602a represents a shape of the waveform that is output by the SG DRV 674a. Voltage waveform 602b represents a shape of the waveform that is output by the SG DRV 674b. Due to an RC delay, the waveform will have a different shape at other locations of the select line SG 614. As noted, the select line SG 614 will have resistance between the first end 586 and the second end 588. Also, there will be some capacitive coupling (represented by parasitic capacitances 608) between the select line SG 614 and other conductive elements, such as the dummy line SGT 614, as well as an immediate neighboring dummy word line (e.g., DD0 or DS0).

Comparator 610 inputs floating voltage 604, as well as a reference voltage (Ref). The output of the comparator 610 may be used to FIG. 6 to determine a condition of a voltage waveform 602 at a target location on the select line SG 614. The target location might be a mid-point of the select line SG 614. That is, the target location could be midway between the first end 586 and the second end 588.

Figure 11:
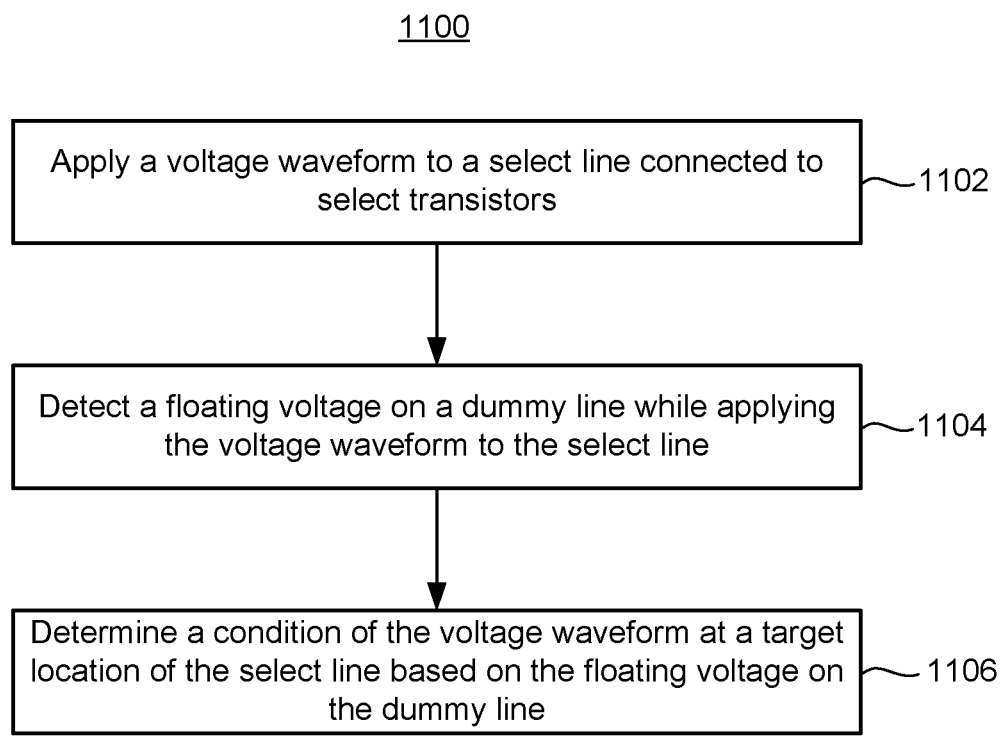
FIG. 11 is a flowchart of one embodiment of a process of determining a condition of a voltage waveform on a select line.

FIG. 11 is a flowchart of one embodiment of a process 1100 of determining a condition of a voltage waveform on a select line. The process 1100 may be performed by an apparatus such as in FIG. 6 or 10, but is not limited thereto. The process 1100 may be used in systems such as depicted in FIGS. 5A-5C, but is not limited thereto. The select line could be on a drain side (e.g., SGD) or a source side (e.g., SGS) of a NAND string that contains memory cells and select transistors. The select line is connected to a select gate on each of the NAND strings. The select gate has one or more select transistors, which may be referred to as operative select transistors. For example, the select line could be any of the select lines depicted in FIG. 4E.

Step 1102 includes applying a voltage waveform 602 to a select line SG 614 that is connected to select gates (e.g., operative select gates). In one embodiment, the voltage waveform 602 is applied to only one end (e.g., 586) of the select line SG 614. In one embodiment, the voltage waveform 602 is applied to two ends (e.g., 586, 588) of the select line SG 614.

Step 1104 includes detecting a floating voltage 604 on a dummy line SGT 612 while applying the voltage waveform 602 to the select line SG 614. In one embodiment, the floating voltage 604 is input to a comparator 610.

Step 1106 includes determining a condition of the voltage waveform 602 at a target location on the select line SG 614 based on the floating voltage on the dummy line SGT 612. In one embodiment, step 1106 includes determining whether the voltage at the target location has charged up to a target voltage level. In one embodiment, step 1106 includes determining whether the voltage at the target location has discharged down to a target voltage level.

The condition of the voltage waveform 602 may be used to make other determinations. For example, based on a magnitude of the voltage on the select line SG 614, a determination may be made whether select gates connected to the select line SG 614 are on or off. As another example, a determination can be made as to when to apply a voltage, such as a program voltage, to a word line.

Figure 12:
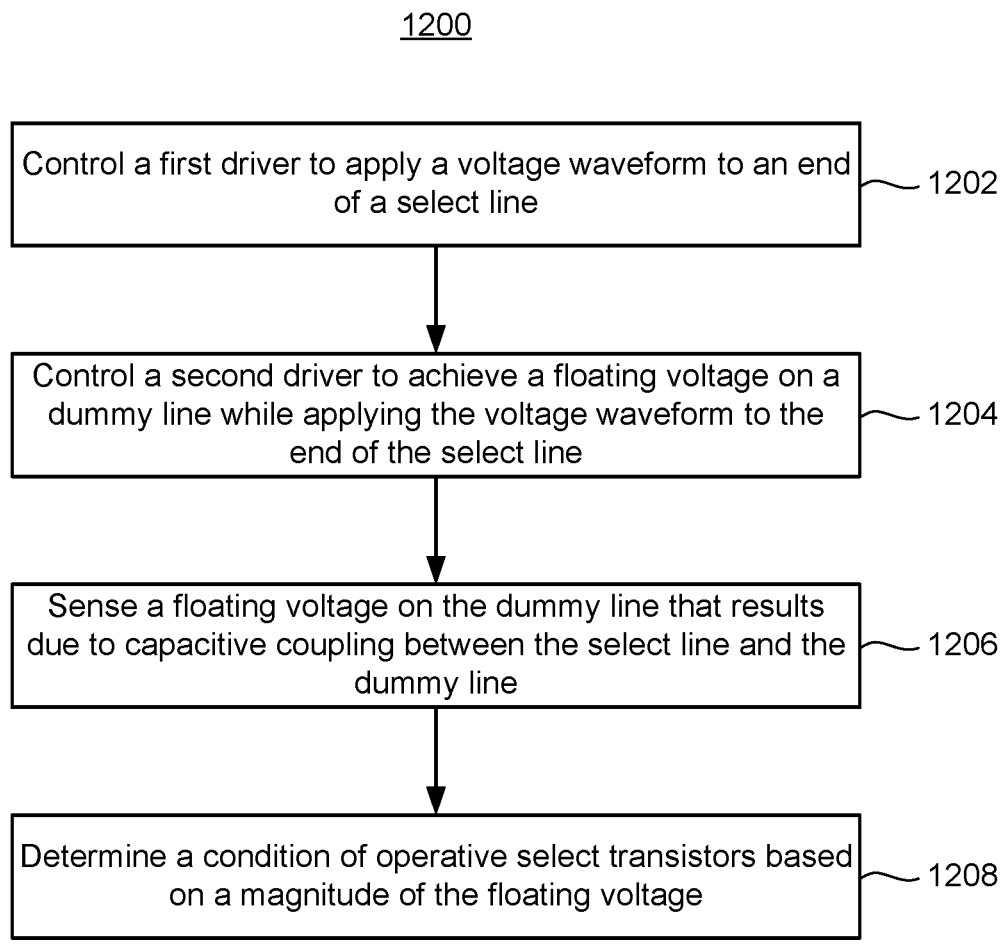
FIG. 12 is a flowchart of one embodiment of a process of determining a condition of operative select gates connected to a select line.

FIG. 12 is a flowchart of one embodiment of a process 1200 of determining a condition of operative select gates whose control gates are connected to a select line. The process 1200 may be performed by an apparatus such as in FIG. 6 or 10, but is not limited thereto. The process 1200 may be used in systems such as depicted in FIGS. 5A-5C, but is not limited thereto. The select line could be on a drain side (e.g., SGD) or a source side (e.g., SGS) of a NAND string that contains memory cells and select gates. The select line is connected to control gates of one or more transistors in an operative select gate on each of the NAND strings.

Step 1202 includes controlling a first driver to apply a voltage waveform 602 to an end of a select line SG 614 that is connected to select gates. In one embodiment, step 1202 includes applying the voltage waveform 602 to only one end (e.g., 586) of the select line SG 614. In one embodiment, step 1202 further includes controlling another driver to apply the voltage waveform 602 to another end of the select line SG 614. Thus, the voltage waveform 602 may be applied to two ends (e.g., 586, 588) of the select line SG 614.

Step 1204 includes controlling a second driver to achieve a floating voltage on a dummy line SGT 612 while applying the voltage waveform 602 to the select line SG 614. The dummy line SGT 612 is connected to dummy select gate on each of the NAND strings.

In one embodiment, first driver is SGD0 DRV 574(0) and second driver is SGDT0 DRV 572(0) (see FIG. 5A). In one embodiment, first driver is SGS0 DRV 582(0) and second driver is SGST0 DRV 584(0) (see FIG. 5A). In one embodiment, first driver is SGD DRV 574 and second driver is SGDT DRV 572 (see FIG. 5B). In one embodiment, first driver is SGS DRV 582 and second driver is SGST DRV 584 (see FIG. 5B). In one embodiment, first driver is SGD DRV 574a and second driver is SGDT DRV 572a (see FIG. 5C), in which case voltage waveform 602 may also be applied to SGD DRV 574b and SGDT DRV 572b may be controlled to achieve the floating voltage on the dummy line SGT 612. In one embodiment, first driver is SGS DRV 582a and second driver is SGDT DRV 584a (see FIG. 5C), in which case voltage waveform 602 may also be applied to SGS DRV 582b and SGDT DRV 584b may be controlled to achieve the floating voltage on the dummy line SGT 612.

Step 1206 includes sensing a floating voltage on the dummy line SGT 612 that results due to capacitive coupling between the select line SG 614 and the dummy line SGT 612. In one embodiment, the floating voltage 604 is input to a comparator 610.

Step 1208 includes determining a condition of the operative select gates based on the floating voltage on the dummy line SGT 612. In one embodiment, step 1208 includes determining whether a set of the operative select gates on the select line SG 614 have turned on (or are conducting). In one embodiment, step 1208 includes determining whether a set of the operative select gates on the select line SG 614 have turned on. In one embodiment, the set of the operative select gates are select gates on unselected NAND strings. Herein an operative select gate that is on an unselected NAND string is referred to as an "unselected operative select gate."

Figure 13:
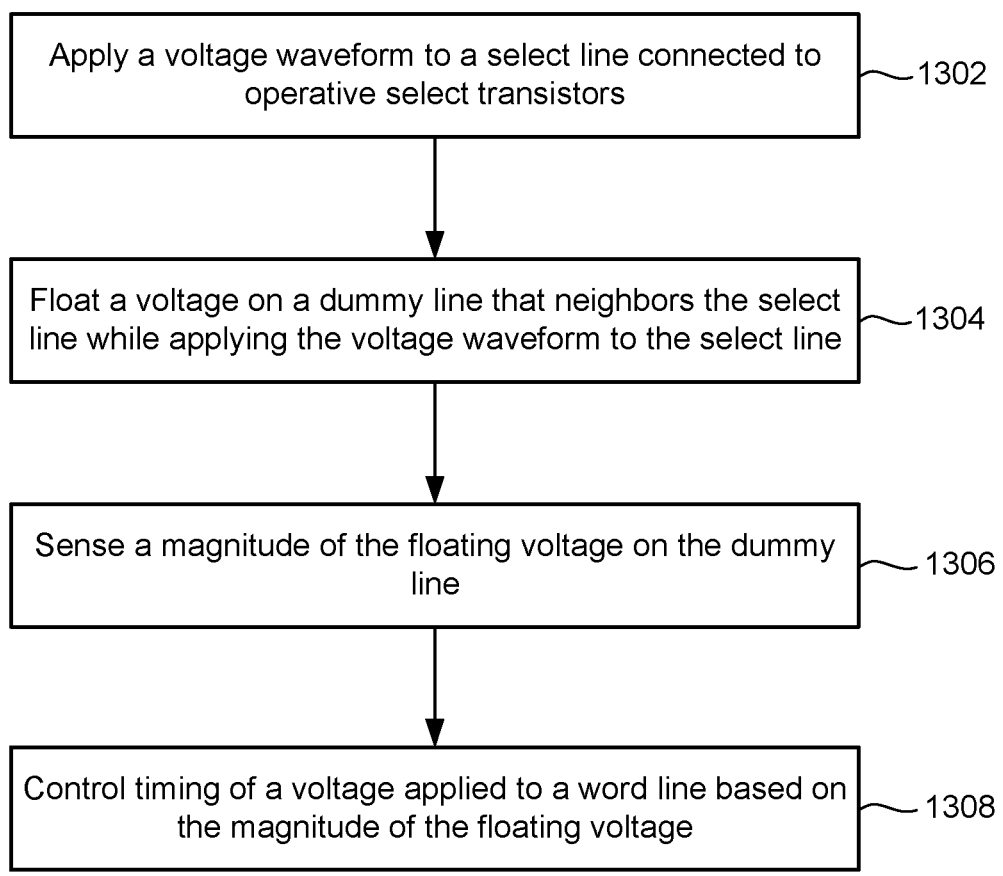
FIG. 13 is a flowchart of one embodiment of a process of controlling the timing of a voltage applied to a word line.

In some embodiments, the magnitude of the floating voltage is used to control the timing of one or more voltages applied to conductive lines in the memory structure 126. FIG. 13 is a flowchart of one embodiment of a process 1300 of controlling the timing of a voltage applied to a word line. The timing is controlled based on a magnitude of a floating voltage on a dummy line, in an embodiment. The process 1300 may be performed by an apparatus such as in FIG. 6 or 10, but is not limited thereto. The process 1300 may be used in systems such as depicted in FIGS. 5A-5C, but is not limited thereto. The select line could be on a drain side (e.g., SGD) or a source side (e.g., SGS) of a NAND string that contains memory cells and select gates. The select line is connected to control gates of an operative select gate on each of the NAND strings. For example, the select line could be any of the select lines depicted in FIG. 4E.

Step 1302 includes applying a voltage waveform 602 to a select line 614 connected to operative select gates. Each operative select gates resides on a different NAND string in a set of NAND strings, in an embodiment. Each of the NAND strings comprises non-volatile memory cells.

Step 1304 includes floating a voltage on a dummy line 612 that immediately neighbors the select line 614 while applying the voltage waveform to the select line. The dummy line 612 is connected to dummy select gates. Each dummy select has one or more dummy select transistors, which may be connected in series. Each dummy select gate resides on one of the NAND strings in the set.

Step 1306 includes sensing a magnitude of the floating voltage on the dummy line 612. In one embodiment, the floating voltage 604 is input to a comparator 610 in order to compare the magnitude of the floating voltage 604 to a reference voltage. Thus, the phrase, "sensing a magnitude of the floating voltage" is intended to include determining whether the magnitude is greater or less than a reference voltage. In some cases, the magnitude of the floating voltage 604 could be determined more precisely. For example, the floating voltage could be compared to multiple reference voltages to determine the magnitude more precisely.

Step 1308 includes controlling timing of a voltage applied to a word line based on the magnitude of the floating voltage 604. The word line is connected to a non-volatile memory cell on each NAND string in the set. In one embodiment, step 1308 includes controlling when a program voltage is applied to a selected word line based on the magnitude of the floating voltage 604. In one embodiment, step 1308 includes controlling when a boosting voltage is applied to an unselected word line during a program operation, based on the magnitude of the floating voltage 604. In one embodiment, step 1308 includes controlling when a read reference voltage is applied to a selected word line based on the magnitude of the floating voltage 604.

Figure 14:
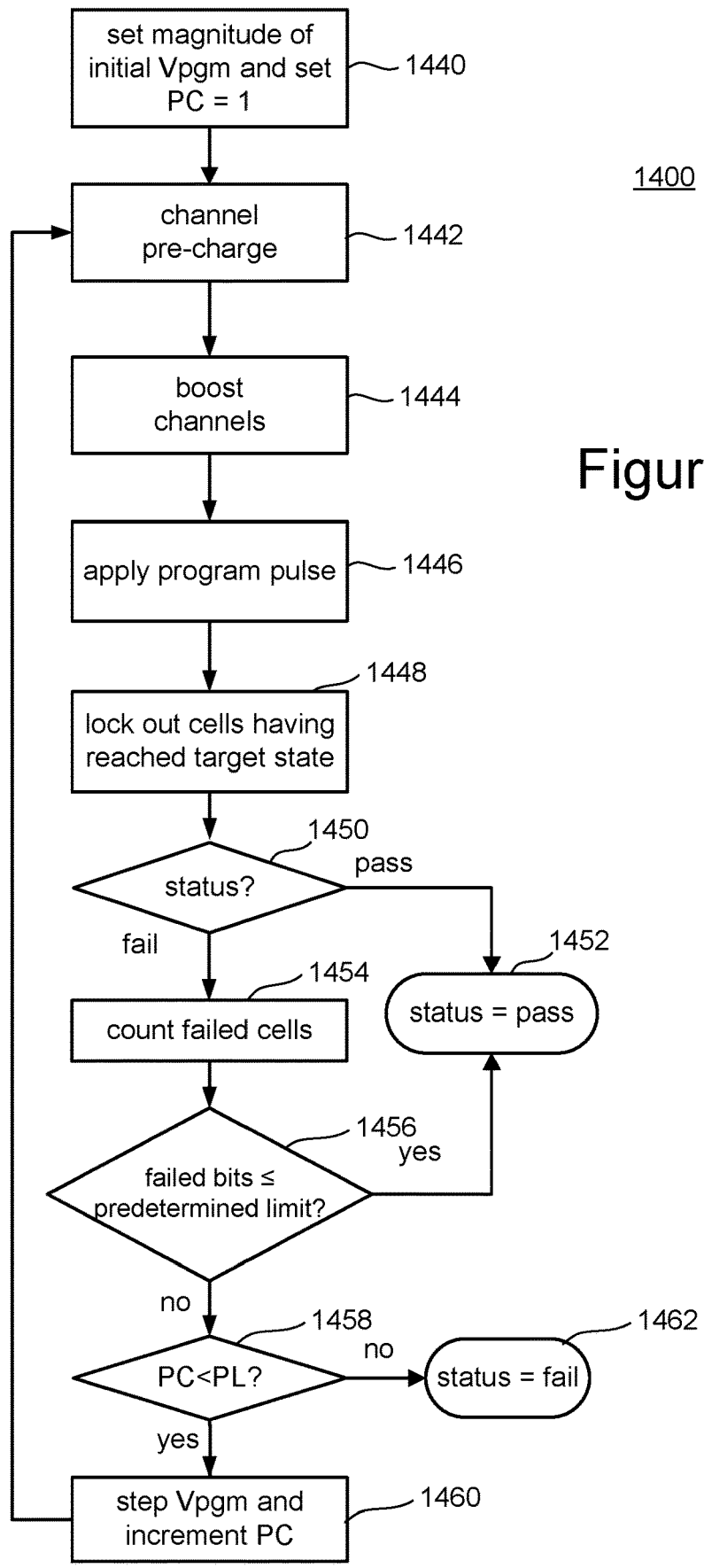
FIG. 14 is a flowchart describing one embodiment of a process for programming NAND strings of memory cells organized into an array.

FIG. 14 is a flowchart describing one embodiment of a process 1400 for programming NAND strings of memory cells organized into an array. In one example embodiment, the process of FIG. 14 is performed on memory die 108 using the control circuit discussed above. For example, the process of FIG. 14 can be performed at the direction of state machine 112.

Typically, the program voltage applied to the control gates (via a selected word line) during a program operation is applied as a series of program pulses. Between at least some of the programming pulses are a set of verify pulses to perform verification. In many implementations, the magnitude of the program pulses is increased with each successive pulse by a predetermined step size. The size of the step varies depending on a level of severity of memory cell mis-shape, in some embodiments. In step 1440 of FIG. 14, the programming voltage (Vpgm) is initialized to the starting magnitude (e.g., ~12-16V or another suitable level) and a program counter PC maintained by state machine 112 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming Additionally, as memory cells reach their intended target data state, they will be inhibited from further programming Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 1442 the memory system will pre-charge channels of NAND strings that include memory cells connected to the selected word line that are to be inhibited from programming In some embodiments, the channel is pre-charged from the drain end of the NAND string. By "drain end" it is meant the end of the NAND string connected to the bit line. In some embodiments, the channel is pre-charged from the source end. By "source end" it is meant the end of the NAND string connected to the source line. In some embodiments, the channel is pre-charged from both the drain end and the source end.

In step 1444, NAND strings that include memory cells connected to the selected word line that are to be inhibited from programming have their channels boosted to inhibit programming Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string. This allows the boosting voltages to boost the potential of the NAND channel.

In step 1446, a program pulse of the program signal Vpgm is applied to the selected word line (the word line selected for programming) If a memory cell on a NAND string should be programmed, then the corresponding bit line is biased at a program enable voltage, in one embodiment. Herein, such a NAND string is referred to as a "selected NAND string." In step 1446, the program pulse is concurrently applied to all memory cells connected to the selected word line so that all of the memory cells connected to the selected word line are programmed concurrently (unless they are inhibited from programming) That is, they are programmed at the same time or during overlapping times (both of which are considered concurrent). In this manner all of the memory cells connected to the selected word line will concurrently have their threshold voltage change, unless they are inhibited from programming.

In step 1448, memory cells that have reached their target states are locked out from further programming Step 1448 may include performing verifying at one or more verify reference levels. In one embodiment, the verification process is performed by testing whether the threshold voltages of the memory cells selected for programming have reached the appropriate verify reference voltage.

In step 1448, a memory cell may be locked out after the memory cell has been verified (by a test of the Vth) that the memory cell has reached its target state.

If, in step 1450, it is determined that all of the memory cells have reached their target threshold voltages (pass), the programming process is complete and successful because all selected memory cells were programmed and verified to their target states. A status of "PASS" is reported in step 1452. Otherwise if, in 1450, it is determined that not all of the memory cells have reached their target threshold voltages (fail), then the programming process continues to step 1454.

In step 1454, the memory system counts the number of memory cells that have not yet reached their respective target threshold voltage distribution. That is, the system counts the number of memory cells that have, so far, failed to reach their target state. This counting can be done by the state machine 112, the controller 122, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 1456, it is determined whether the count from step 1454 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 1452. In this situation, enough memory cells programmed correctly such that the few remaining memory cells that have not been completely programmed can be corrected using ECC during the read process. In some embodiments, the predetermined limit used in step 1456 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 1458 and the program counter PC is checked against the program limit value (PL). Examples of program limit values include 14, 12, 16, 19 and 30; however, other values can be used. If the program counter PC is not less than the program limit value PL, then the program process is considered to have failed and a status of FAIL is reported in step 1462. If the program counter PC is less than the program limit value PL, then the process continues at step 1460 during which time the Program Counter PC is incremented by 1 and the program voltage Vpgm is stepped up to the next magnitude. For example, the next pulse will have a magnitude greater than the previous pulse by a step size (e.g., a step size of 0.1-1.0 volts). After step 1460, the process loops back to step 1442 and another program pulse is applied to the selected word line so that another iteration (steps 1442-1460) of the programming process of FIG. 14 is performed.

Figure 15:
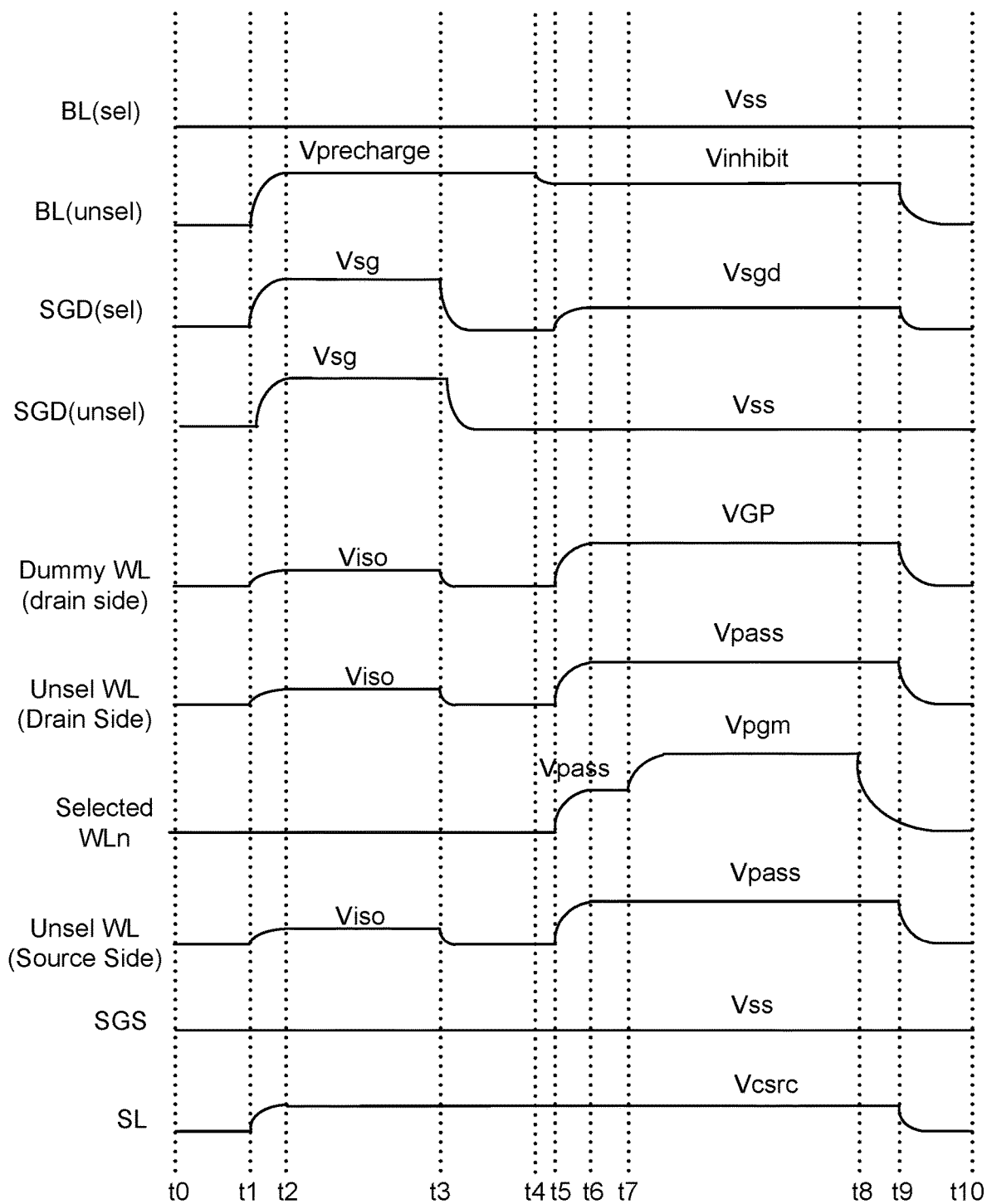
FIG. 15 is a signal diagram depicting the behavior of various signals during pre-charge, boosting and programming.

FIG. 15 is a signal diagram depicting the behavior of various signals during pre-charge, boosting and programming Thus, FIG. 15 shows behavior of signals during steps 1442, 1444 and 1446 of FIG. 14. Some embodiments include controlling the timing of when one or more of these voltages is applied based on the floating voltage on a dummy line.

The signals depicted in FIG. 15 include the selected bit lines BL(sel), unselected bit lines BL(unsel), drain side selection line SGD(sel) for a selected sub-block, drain side select lines SGD(unsel) for unselected sub-blocks, dummy word lines adjacent to the SGD, unselected drain side word lines, selected word line WLn, source side unselected word lines, source side select lines SGS, and source line SL. An example of SGD(sel) for a selected sub-block is regions SGD0A, SGD1A, and SGD2A (which may be connected together) in FIG. 4E under the assumption that sub-block SBA is selected. In this case, sub-blocks SBB, SBC and SBD are not selected. Hence, regions SGD0B, SGD1B, and SGD2B (which may be connected together) are an example of SGD(unsel) for unselected sub-block SBB. Likewise, regions SGD0C, SGD1C, and SGD2C which may be connected together ( ) are an example of SGD(unsel) for unselected sub-block SBC. Likewise, regions SGD0D, SGD1D, and SGD2D (which may be connected together) are an example of SGD(unsel) for unselected sub-block SBD. The selected bit lines BL(sel) are connected to NAND strings that are selected for programming. The unselected bit lines BL(unsel) are connected to NAND strings that are not selected for programming. The dummy line(s) are not depicted in FIG. 15, as the voltage on the dummy line(s) is left floating. Therefore, the voltage on a dummy line is free to change based on capacitive coupling with an adjacent select line.

At time t0 of FIG. 15, all the depicted signals are at 0 volts. The selected bit line BL(sel), drain side selection line SGD (unsel) for unselected sub-blocks, and the source side select lines SGS are all at 0 volts (Vss) during the entire timeframe depicted in FIG. 15.

The time period of FIG. 15 from t1-t3 corresponds to pre-charging (see step 1442 of FIG. 14. At time t1, the source line SL is raised to Vcsrc (e.g. ~2.5-3.5 volts), the unselected bit lines are raised to a pre-charge voltage Vprecharge (e.g., ~2 volts), the drain side select line SGD(sel) connected to selected sub-block is raised to Vsg (e.g., ~6 volts), the drain side select line SGD(unsel) connected to unselected sub-blocks is raised to Vsg (e.g., ~6 volts), the drain side dummy WL is raised to Viso (e.g., ~1 volt), and the unselected WLs are raised to Viso (e.g., ~1 volt). At time t3, SGD(sel), SGD(unsel), the dummy word lines and the unselected word lines are all lowered to ground/Vss. At this point in time the pre-charge process has completed and the drain side of channel of the unselected NAND strings should be pre-charged to a positive voltage.

The time period of FIG. 15 from t4-t10 corresponds to boosting the channels of unselected NAND strings and applying the program signal/pulse (see steps 1444 and 1446 of FIG. 14). At time t4, the unselected bit lines are lowered from Vprecharge to Vinhibit (e.g. ~1-3.5 volts). At time t5, the drain side selection line SGD(sel) connected to the selected sub-block is raised to Vsgd (e.g., ~3 volts), the selected word line WLn is raised to a boosting voltage Vpass (e.g., 6-10 volts), the unselected word lines are raised to the boosting voltage Vpass, and the dummy word lines are raised to VGP (e.g., ~3.5 volts). In some embodiments, the magnitude of the boosting voltage differs depending on the location of the unselected word line relative to the selected word line. For example, unselected word lines adjacent to the selected word line may receive a different magnitude boosting voltage than word lines farther from the selected word line. As another example, source side unselected word lines may receive a different boosting voltage than drain side unselected word lines.

Because the bit lines of unselected NAND strings will be at Vinhibit, the select gates will cut off the connected bit line from the channel and the boosting voltages (e.g., Vpass) will cause the channel voltage to increase (boosted). Because the channel voltage increases, the differential between the channel voltage and the selected word line voltage will be too small to allow for programming.

At time t7, the voltage applied to the selected word line WLn is raised to the magnitude of the program pulse Vpgm, which can be between 12 and 24 volts. In one embodiment, each successive program pulse is higher in magnitude than a previous program pulse by a step size. The program pulse is applied on WLn from t7-t8, which corresponds to one iteration of step 1446 of FIG. 14.

At time t8, the selected word line WLn is lowered to ground. At time t9, the unselected bit lines BL(unsel), drain side selection line SGD(sel) for selected sub-blocks, dummy word lines, selected word line WLn, unselected word lines, and source line SL are lowered to ground.

Note that when the program voltage is applied to the selected word lines, the drain side select gate (SGD) of unselected word lines should be off in order to properly cut the unselected NAND string off from the bit line. This is needed in order to properly boost the voltage in the channel of unselected NAND strings to prevent program disturb. If the voltage on the select line SGD is too high, then the select gate of an unselected NAND string may either be on, or at least weakly on, which could result in a failure to properly boost the NAND string channel voltage.

Figure 16:
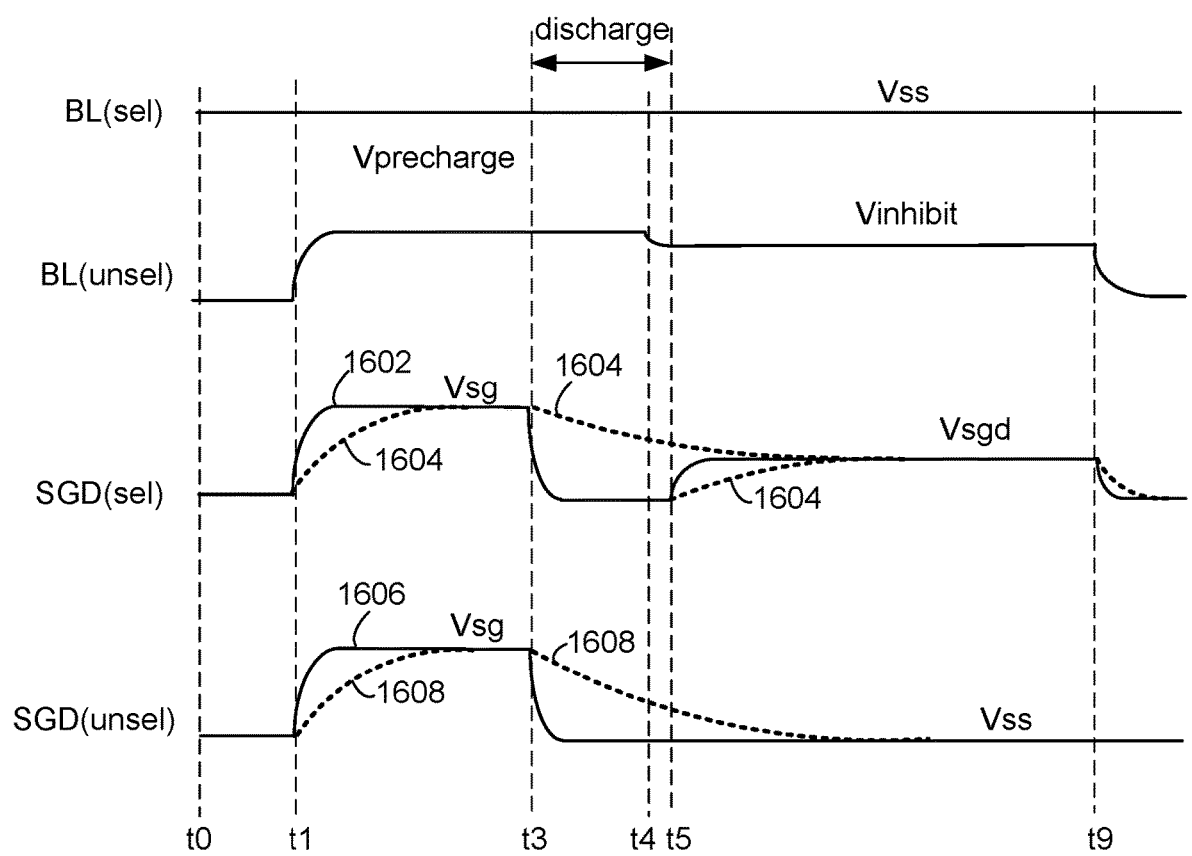
FIG. 16 depicts some of the waveforms from FIG. 15, with additional waveforms in dashed lines to demonstrate potential problems due to RC delay.

FIG. 16 depicts some of the waveforms from FIG. 15, with additional waveforms in dashed lines to demonstrate potential problems due to RC delay. The difference in voltage between the select line (SGD) and the bit line (BL) determines whether the select gate is on or off. For unselected NAND strings, the select transistor(s) should be off between time t5 and t9 (during which time the boosting voltages and program voltage are applied). A select transistor will be off if the difference between its control gate voltage (due to its location on the select line) and its bit line voltage is less than the Vt of the select transistor. FIG. 16 indicates that the time between t3 and t5 is a discharge time to allow the select lines SGD to discharge.

Due to RC delay on the select line, the voltage on one location of the select line might not be the same as another location at a particular point in time. The solid line 1602 represents the voltage on the select line near the select line driver for the select line in the selected sub-block. The dashed line 1604 represents the voltage on the select line the unselected sub-block at the end far from the driver. The solid line 1606 represents the voltage on the select line near the select line driver for the select line in the unselected sub-block. The dashed line 1608 represents the voltage on the select line the unselected sub-block at the end far from the driver. These examples assume that the respective drivers apply the voltage to one end of the select line (see, for example, FIG. 6). Thus, solid line 1602 represents waveform 602 at the first end 586 of the SG 614, and dashed line 1604 represents waveform 602 at the second end 588 of the SG 614, in one embodiment. Likewise, solid line 1606 represents waveform 602 at the first end 586 of the SG 614, and dashed line 1608 represents waveform 602 at the second end 588 of the SG 614, in one embodiment.

Dashed lines 1604 and 1608 show that the select line voltage might remain at a relatively high level past time t5. If the voltage on the select line is too high past time t5, then the select transistor will not turn off, or may be weakly on. For NAND strings in the selected sub-block that are connected to an inhibited but line, the select transistor should be off to allow for proper boosting of the NAND channel to prevent program disturb. However, curve 1604 shows that the voltage on at least some portion of the select line may be too high, such that the select transistor is not off. For NAND strings in the unselected sub-block, the select transistor should be off regardless of the voltage on the bit line to allow for proper boosting of the NAND channel to prevent program disturb. However, curve 1608 shows that the voltage on at least some portion of the select line may be too high, such that the select transistor is not off.

As noted above, there can be considerable variation in the select line RC delay for different select lines. As noted above the time between t3 and t5 may be referred to as a discharge time to allow the select lines to discharge. If the discharge is not long enough, then the channel voltage of unselected NAND strings might not be adequately boosted to prevent program disturb. One possible solution to the problem of variance in RC delay is to always use a long delay between time t3 and t5 in order to assure that even for a worst case RC delay the select line voltage will have dropped to a sufficient level to assure that the select transistors that are to be off after time t5 are indeed off. However, this will extend the amount of time it takes to program the memory cells. Note that there may be numerous program loops, such that the added delay gets experienced with each loop.

In some embodiments, the timing of applying voltages is based on the magnitude of the floating voltage on the dummy line SGT 612. This can assure that select transistors that should be off are indeed off, without extending the program time. In other words, if more time is needed to accommodate a large RC delay on the select line, then the time between t3 and t5 may be increased as a consequence of monitoring the floating voltage on the dummy line SGT 612. On the other hand, if less time is needed to accommodate a small RC delay on the select line, then the time between t3 and t5 may be decreased as a consequence of monitoring the floating voltage on the dummy line SGT 612. Therefore, programming time may be reduced while avoiding program disturb.

Figure 17:
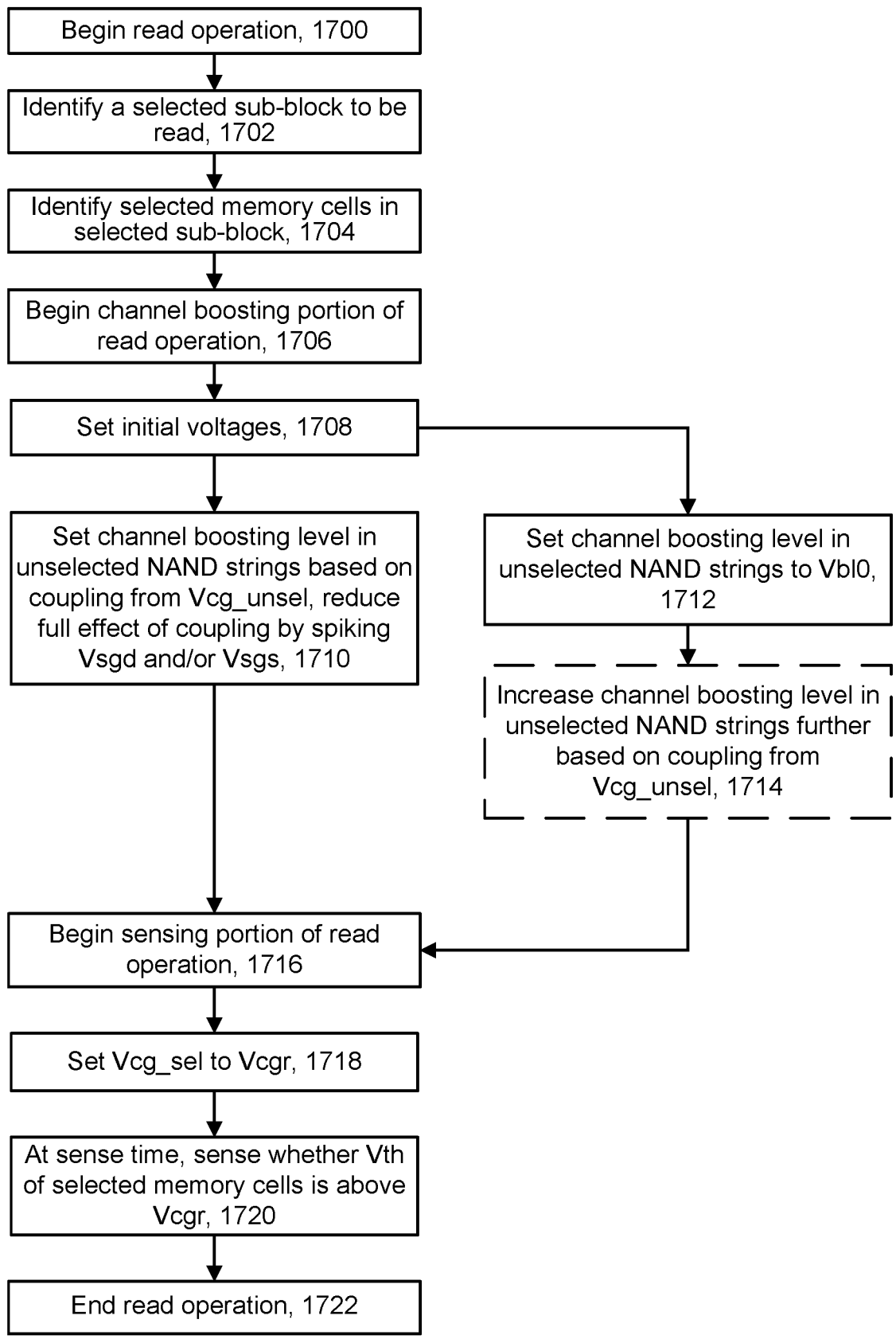
FIG. 17 depicts a sense operation for a block of memory cells.

FIG. 17 depicts a sense operation for a block of memory cells. The sense operation may be a read operation or a verify operation. A read operation begins at step 1700. Step 1702 identifies a selected sub-block of memory cells to be read. Step 1704 identifies selected memory cells in a selected sub-block. For example, all memory cells connected to a selected word line in a sub-block can be read. For example, with respect to FIG. 4E, all memory cells connected to WLL62 in sub-block SBA can be read as selected memory cells. The memory cells to be read in the selected sub-block are selected memory cells and the associated NAND strings in which the selected memory cells are located are selected NAND strings. The memory cells which are not to be read in the selected sub-block are unselected memory cells, although these unselected memory cells can be part of selected NAND strings. For example, memory cells connected to WLL0-WLL61 and WLL63 in sub-block SBA are unselected when WLL62 is the selected word line. A sub-block which is not currently selected to be read is an unselected sub-block and its memory cells are unselected memory cells in unselected NAND strings. For example, all memory cells in sub-blocks SBB, SBC, and SBC are unselected when SBA is the selected sub-block. Likewise, all NAND strings in sub-blocks SBB, SBC, and SBC are unselected NAND strings when SBA is the selected sub-block. Likewise, all select lines in sub-blocks SBB, SBC, and SBC are unselected select lines when SBA is the selected sub-block. For example, when SBA is selected such that selected memory cells in SBA are read, select lines SGD0A, SGD1A, and SGD2A) are selected (note these select lines SGD0A, SGD1A, and SGD2A may be connected, and hence considered to be a single select line). On the other hand, when SBA is selected such that selected memory cells in SBA are read, select lines SGD0B, SGD1B, and SGD2B are unselected select lines (note these select lines SGD0B, SGD1B, and SGD2B may be connected, and hence considered to be a single unselected select line). In one approach, the selected memory cells store a unit of data such as a page.

The identifying steps can be performed by control circuitry. A read operation can be initiated by control circuitry of the memory device independently of an external host controller, or in response to a command from an external host controller, for instance.

Step 1706 begins a channel boosting portion of the read operation. Step 1708 sets initial voltages. Multiple approaches can be followed next. In one approach, step 1710 sets a channel boosting level in the unselected NAND strings based on coupling from Vcg_unsel, which is the control gate voltage of the unselected memory cells, which can be applied to control gates via a word line layer or portion. Additionally, the full effect of coupling is reduced by spiking a voltage applied to SGD and/or SGS, as discussed further in connection with FIGS. 18A-18E. In another approach, step 1712 sets a channel boosting level in the unselected NAND strings to Vbl0. Vbl0 is an elevated non-zero voltage (e.g., 2-3 V) which is applied on bit lines which are connected to the unselected NAND strings (this could be all bit lines in a block). Optionally, step 1714 is also performed to increase the channel boosting level in the unselected NAND strings further based on coupling from unselected word lines.

Step 1716 begins the sensing portion of the read operation. This includes, at step 1718, setting the selected WL voltage to a read reference voltage (e.g., Vcgr). The selected WL is connected to the control gates of the selected memory cells. Step 1720, at a sense time, senses whether the Vth of the selected memory cells is above Vcgr. Step 1722 ends the read operation. The read operation can be repeated for an additional Vcgr level. Typically, N–1 read operations using Vcgr levels are used when the memory cells are programmed to N data states. The Vth of a selected memory cell is at or above Vcgr when sensing circuitry determines that the associated NAND string is non-conductive. Likewise, the Vth of a selected memory cell is below Vcgr when sensing circuitry determines that the associated NAND string is conductive.

Figure 18A:
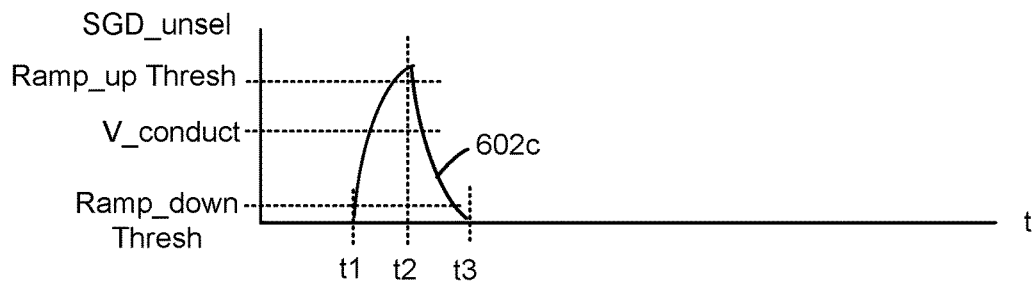
FIGS. 18A-18E depict voltages that are applied during one embodiment of the read process depicted in FIG. 17.
Figure 18B:
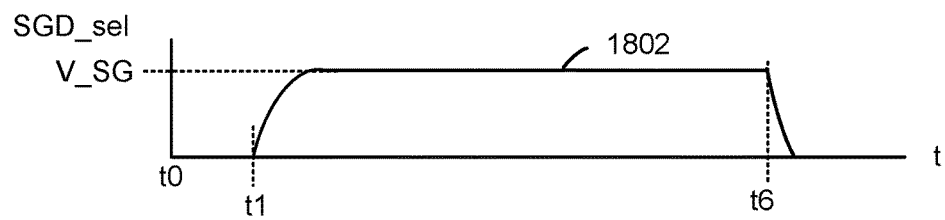
Figure 18C:
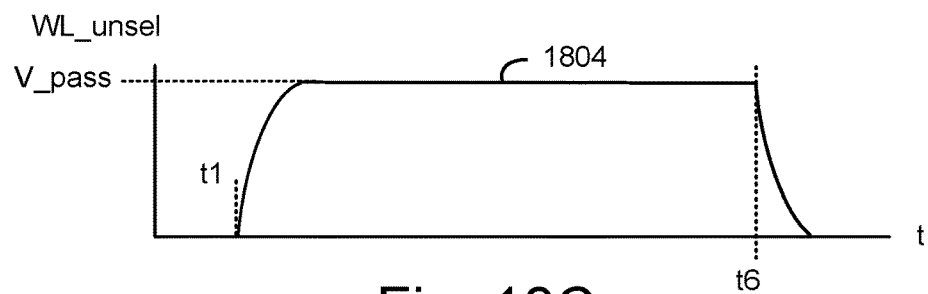
Figure 18D:
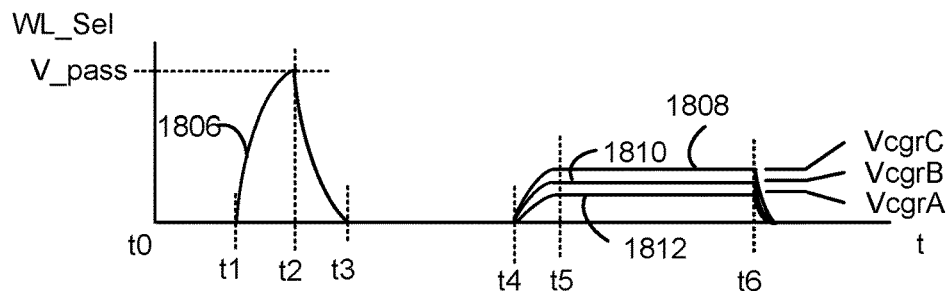
Figure 18E:
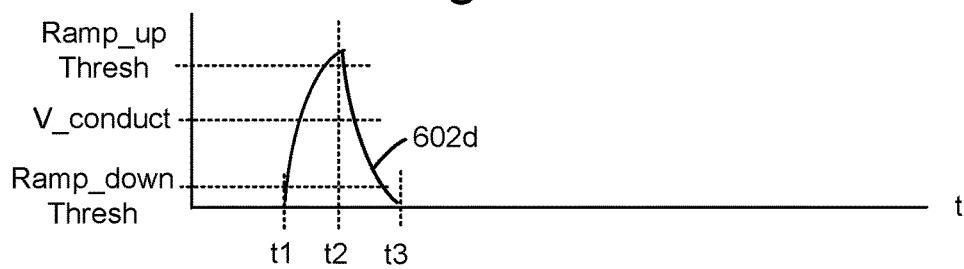

FIGS. 18A-18E depict voltages that are applied during one embodiment of the read process depicted in FIG. 17. In one embodiment, a spike shaped voltage (e.g., voltage spike) is applied to both the SGD select line and the SGS select line. In one embodiment, a spike shaped voltage is applied to the SGD select line, but not to the SGS select line. FIG. 18A depicts one example of a spike shaped voltage waveform 602c that is applied to the SGD select line for unselected sub-blocks. A similar spike shaped voltage waveform 602d may optionally be applied to SGS select line for unselected sub-blocks, as depicted in FIG. 18E. A spike shaped voltage waveform can be a voltage waveform that is increased toward a commanded level and abruptly decreased. A spike shaped voltage waveform can be characterized by its peak amplitude and its duration, e.g., overall duration, or duration above a specified amplitude. In some embodiments, the spike shaped voltage waveform 602 is controlled based on the floating voltage on the dummy line SGT 612.

A spike shaped voltage waveform may also be applied to the selected word line, as depicted in FIG. 18D. Waveform 602c in FIG. 18A transitions or spikes up from 0 V starting at t1, reach a peak at t2, and falls back to 0 V at time t3. Waveform 1806 in FIG. 18D transitions or spikes up from 0 V starting at t1, reach a peak at t2, and falls back to 0 V at time t3. Waveform 602c in FIG. 18E transitions or spikes up from 0 V starting at t1, reach a peak at t2, and falls back to 0 V at time t3. At time t1, the voltage 1802 on the SGG select line for the selected sub-block is raised. At time t1, the voltage 1804 on the unselected word lines is raised.

Due to finite response times and RC delays, the actual level of waveforms 602c, 602d will transition up over a period of time from t1-t2. A voltage level V_conduct refers to the voltage that is sufficient to place the select transistors into a conductive state. The actual value for V_conduct will depend on the Vt of the select transistor. Thus, prior to the waveform 602c, 603d reaching a sufficient level (e.g., V_conduct), the select transistor will be off. As long as the waveform 602c, 603d is above a sufficient level (e.g., V_conduct), the select transistor will be off. At time t2, the control circuit requests that the voltages on SGD_unsel and SGS_unselect return to 0V, in response to which waveforms 602c and 602d decay toward 0 V.

In some embodiments, the floating voltage 604 on the dummy line SGD 612 is used to determine when time t2 and/or t3 has been reached, or is nearly reached. In one embodiment, the floating voltage is monitored to determine that waveform 602c is at a sufficient level such that waveform 602c may allow to decay to 0V. In one embodiment, the floating voltage is monitored to determine that waveform 602d is at a sufficient level such that waveform 602d may decay to 0V. In one embodiment, the reference voltage that is input to comparator 610 is based on the Ramp_up Thresh voltage level depicted in FIG. 18A or FIG. 18E. The actual reference voltage (Vref) is not necessarily exactly equal to Ramp_up Thresh in the event that the capacitive coupling ratio between the select line SG 614 and the dummy line SGD 612 less than 1.

In one embodiment, the floating voltage 604 is monitored to determine that waveform 602c has decayed to 0V, or at least is sufficiently close to 0V such that the drain side select transistors (for unselected sub-blocks) are off. In one embodiment, the floating voltage 604 is monitored to determine that waveform 602d has decayed to 0V, or at least is sufficiently close to 0V such that the source side select transistors (for unselected sub-blocks) are off. In one embodiment, the reference voltage that is input to comparator 610 is based on the Ramp_down Thresh voltage level depicted in FIG. 18A or FIG. 18E. The actual reference voltage (Vref) is not necessarily exactly equal to Ramp_down Thresh in the event that the capacitive coupling ratio between the select line SG 614 and the dummy line SGD 612 less than 1.

In FIG. 18B, waveform 1802 represents SGD_sel, which transitions from 0 V at t0 to a level referred to as V_SG at t1, remain at V_SG, a steady state level, for a duration of the read operation, and transition back to 0 V at t6. Here, SGD_sel refers to the both the drain side select line and the source side select line in the selected sub-block. The drain and source side select transistors for the selected sub-block will enter a conductive state shortly after t1.

In FIG. 18C, waveform 1804 represents the voltage applied to unselected word lines. The waveform 1804 transitions from 0 V at t1 to a steady state level of_pass, in one continuous increase, remains at Vpass until t6, and transitions back to 0 V at t6. V_pass is the voltage applied to the control gate of unselected memory cells V_pass is sufficiently high to provide all unselected memory cells in a conductive state.

In FIG. 18D, the waveforms represent options for voltages applied to the selected word line (WL_Sel). Waveform 1806 transitions from 0 V to V_pass and back to 0 V, in a boosting phase of a read operation, and then to Vcgr and back to 0 V, in a sensing phase of a read operation. For example, waveform 1806 transitions up from 0 V at t1, reaching V_pass at t2, and transitioning back to 0 V after t2. Raising WL_Sel above the Vth of the selected memory cells causes the selected memory cells to be in a conductive state. At t4, WL_Sel transitions from 0 V to one of the Vcgr read reference voltages, such as VcgrA 1812, VcgrB 1810 or VcgrC 1808, and remains at that level until t6. The read reference voltages VcgrA 1812, VcgrB 1810 and VcgrC may be used to determine which of four states a memory cell is in. This is for an example in which each memory cell stores two bits. Embodiments can be used for memory cells that store one bit for cell, as well as for three or more bits per cell.

Since V_pass causes the unselected memory cells in a NAND string to be in a conductive state, the conductive state of the NAND string as determined by sensing indicates the conductive state of the selected memory cell. With Vcgr applied to the selected memory cell, the conductive state of the NAND string indicates whether the Vth of the selected memory cell exceeds Vcgr.

Referring back to FIG. 18A, from t1 until the waveform 602c reaches V_conduct the SGD select transistors of the unselected NAND strings are in a non-conductive state so that the channel is isolated. Likewise, referring back to FIG. 18E, from t1 until the waveform 602d reaches V_conduct the SGS select transistors of the unselected NAND strings are in a non-conductive state so that the channel is isolated. As a result, when waveform 1804 on the unselected word lines is ramped up, the channel voltage of an unselected NAND string, increases due to capacitive coupling. While the SGD and SGS select transistors for the unselected NAND strings are in a conductive state, the drain end of the channel will communicate with the bit line which is at a level, e.g., between 0 V and Vbl0, and the source end of the channel will communicate with the source line which is at, e.g., 0 V. During this time, the NAND channel voltage will be governed by the driving voltages at the opposing ends (e.g., the bit line and source line). After waveforms 602c and 602d fall below V_conduct, the channel is isolated again due to the SGD and SGS select gates becoming non-conductive. This may result in the NAND channel voltage increasing. By making the SGD and SGS select gates of an unselected NAND string temporarily and briefly conductive during the increase of WL_unsel, capacitive coupling from WL_sel is temporarily interrupted. As waveform 1804 continues to ramp up, the NAND channel voltage increases due to capacitive coupling from WL_unsel. When waveform 1804 is steady at V_pass, the NAND channel voltage does not increase since there is no capacitive coupling from the steady voltage.

A first embodiment disclosed herein includes an apparatus comprising NAND strings. Each NAND string comprises non-volatile memory cells, an operative select gate, and a dummy select gate. The apparatus comprises a select line connected to the operative select gate of each NAND string, and a dummy line connected to the dummy select gate of each NAND string. The dummy line is an immediate neighbor to the select line. The apparatus comprises a control circuit configured to apply a voltage waveform to the select line while the dummy line is floating. The control circuit is configured to detect a floating voltage on the dummy line while applying the voltage waveform to the select line. The control circuit is configured to determine a condition of the voltage waveform at a target location on the select line based on the floating voltage on the dummy line.

In a second embodiment, and in furtherance to the first embodiment, the condition is that the voltage waveform has reached a ramp up threshold at the target location on the select line.

In a third embodiment, and in furtherance to the first embodiment, the condition is that the voltage waveform has reached a ramp down threshold at the target location on the select line.

In a fourth embodiment, and in furtherance to any of the first to third embodiments, the control circuit is further configured to detect when the operative select gates at the target location on the select line turn on or turn off based on a magnitude of the floating voltage of the dummy line.

In a fifth embodiment, and in furtherance to any of the first to fourth embodiments, the control circuit is further configured to detect when all unselected operative select gates connected to the select line are turned off based on a magnitude of the floating voltage of the dummy line.

In a sixth embodiment, and in furtherance to any of the first to fifth embodiments, the control circuit is further configured to control timing of a voltage applied to one or more of the memory cells based on the condition of the voltage waveform at the target location on the select line.

In a seventh embodiment, and in furtherance to any of the first to sixth embodiments, the control circuit is further configured to determine when to apply a program voltage to a selected word line based on the condition of the voltage waveform at the target location on the select line.

In an eighth embodiment, and in furtherance to any of the first to seventh embodiments, the voltage waveform is a voltage spike; the NAND strings of are unselected NAND strings during a sense operation; and the control circuit is further configured to detect when the voltage spike has increased to a threshold level at the target location on the select line based on a magnitude of the floating voltage on the dummy line.

In a ninth embodiment, and in furtherance to any of the first to eighth embodiments, the voltage waveform is a voltage spike; the NAND strings are unselected NAND strings during a sense operation; and the control circuit is further configured to detect when the voltage spike has decreased to a threshold level at the target location on the select line based on a magnitude of the floating voltage on the dummy line.

An embodiment includes a method comprising applying a voltage waveform to a select line connected to operative select gates. Each operative select gate resides on a different NAND string in a set of NAND strings. The method includes floating a voltage on a dummy line that immediately neighbors the select line while applying the voltage waveform to the select line. The dummy line is connected to dummy select gates. Each dummy select gate resides on one of the NAND strings in the set. Each NAND string comprises non-volatile memory cells. The method includes sensing a magnitude of the floating voltage on the dummy line. The method includes controlling timing of a voltage applied to a word line based on the magnitude of the floating voltage, the word line connected to a non-volatile memory cell on each NAND string in the set.

An embodiment includes a non-volatile storage device comprising NAND strings of non-volatile memory cells. Each NAND string comprises non-volatile memory cells, one or more operative select transistors at an end of the NAND string, and one or more dummy select transistors at the end of the NAND string. The non-volatile storage device further comprises a select line connected to the one or more operative select transistors. The non-volatile storage device further comprises a dummy line connected to the one or more dummy select transistors. The dummy line is an immediate neighbor to the select line. The non-volatile storage device further comprises a first driver connected to the select line, a second driver connected to the dummy line, and a control circuit. The control circuit is configured to control the first driver to apply a voltage waveform the select line. The control circuit is configured to control the second driver to achieve a floating voltage on the dummy line while applying the voltage waveform to the select line. The control circuit is configured to sense the floating voltage at the dummy line that results due to capacitive coupling between the select line and the dummy line. The control circuit is configured to determine a condition of a set of the operative select transistors based on a magnitude of the floating voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
    NAND strings, each NAND string comprising non-volatile memory cells, an operative select gate, and a dummy select gate;
    a select line connected to the operative select gate of each NAND string;
    a dummy line connected to the dummy select gate of each NAND string, the dummy line is an immediate neighbor to the select line; and
    a control circuit configured to:
        apply a voltage waveform to the select line while the dummy line is floating;
        detect a floating voltage on the dummy line while applying the voltage waveform to the select line; and
        determine a condition of the voltage waveform at a target location on the select line based on the floating voltage on the dummy line.

2. The apparatus of claim 1, wherein the condition is that the voltage waveform has reached a ramp up threshold at the target location on the select line.

3. The apparatus of claim 1, wherein the condition is that the voltage waveform has reached a ramp down threshold at the target location on the select line.

4. The apparatus of claim 1, wherein the control circuit is further configured to detect when the operative select gates at the target location on the select line turn on or turn off based on a magnitude of the floating voltage of the dummy line.

5. The apparatus of claim 1, wherein the control circuit is further configured to detect when all unselected operative select gates connected to the select line are turned off based on a magnitude of the floating voltage of the dummy line.

6. The apparatus of claim 1, wherein the control circuit is further configured to control timing of a voltage applied to one or more of the memory cells based on the condition of the voltage waveform at the target location on the select line.

7. The apparatus of claim 1, wherein the control circuit is further configured to determine when to apply a program voltage to a selected word line based on the condition of the voltage waveform at the target location on the select line.

8. The apparatus of claim 1, wherein:
    the voltage waveform is a voltage spike;
    the NAND strings are unselected NAND strings during a sense operation; and
    the control circuit is further configured to detect when the voltage spike has increased to a threshold level at the target location on the select line based on a magnitude of the floating voltage on the dummy line.

9. The apparatus of claim 1, wherein:
    the voltage waveform is a voltage spike;
    the NAND strings are unselected NAND strings during a sense operation; and
    the control circuit is further configured to detect when the voltage spike has decreased to a threshold level at the target location on the select line based on a magnitude of the floating voltage on the dummy line.

10. A method comprising:
    applying a voltage waveform to a select line connected to operative select gates, each operative select gate resides on a different NAND string in a set of NAND strings;
    floating a voltage on a dummy line that immediately neighbors the select line while applying the voltage waveform to the select line, the dummy line connected to dummy select gates, each dummy select gate resides on one of the NAND strings in the set, each NAND string comprises non-volatile memory cells;
    sensing a magnitude of the floating voltage on the dummy line; and
    controlling timing of a voltage applied to a word line based on the magnitude of the floating voltage, the word line connected to a non-volatile memory cell on each NAND string in the set.

11. The method of claim 10, wherein controlling timing of the voltage applied to the word line based on the magnitude of the floating voltage comprises:
    controlling when a program voltage is applied to the word line.

12. The method of claim 11, further comprising:
    determining when operative select gates on unselected NAND strings have turned off as a condition to apply the program voltage to the word line.

13. The method of claim 11, wherein controlling timing of the voltage applied to the word line based on the magnitude of the floating voltage comprises:
 controlling when a read reference voltage is applied to the word line.

14. The method of claim 13, wherein:
 the voltage waveform is a voltage spike; and
 controlling when the read reference voltage is applied to the word line comprises determining that the magnitude of the floating voltage indicates that the voltage spike has decreased to a threshold level as a condition to apply the read reference voltage.

15. The method of claim 10, further comprising:
 controlling when the voltage waveform discharged based on the magnitude of the floating voltage.

16. A non-volatile storage device comprising:
 NAND strings of non-volatile memory cells, each NAND string comprising non-volatile memory cells, one or more operative select transistors at an end of the NAND string, and one or more dummy select transistors at the end of the NAND string;
 a select line connected to the one or more operative select transistors;
 a dummy line connected to the one or more dummy select transistors, the dummy line is an immediate neighbor to the select line;
 a first driver connected to the select line;
 a second driver connected to the dummy line; and
 a control circuit configured to:
  control the first driver to apply a voltage waveform the select line;
  control the second driver to achieve a floating voltage on the dummy line while applying the voltage waveform to the select line;
  sense the floating voltage at the dummy line that results due to capacitive coupling between the select line and the dummy line; and
  determine a condition of a set of the operative select transistors based on a magnitude of the floating voltage.

17. The non-volatile storage device of claim 16, wherein the condition is that all operative select transistors in the set are not conducting.

18. The non-volatile storage device of claim 17, wherein the set of the operative select transistors comprises select transistors on unselected NAND strings.

19. The non-volatile storage device of claim 17, wherein the control circuit is further configured to control timing of a boosting voltage applied to word lines connected to the non-volatile memory cells on the NAND strings based on a determination that the operative select transistors in the set are not conducting.

20. The non-volatile storage device of claim 17, wherein the condition is that all operative select transistors in the set are conducting.

* * * * *